(12) United States Patent
Koshiishi et al.

(10) Patent No.: US 8,512,510 B2
(45) Date of Patent: Aug. 20, 2013

(54) PLASMA PROCESSING METHOD AND APPARATUS

(75) Inventors: Akira Koshiishi, Nirasaki (JP); Jun Hirose, Nirasaki (JP); Masahiro Ogasawara, Nirasaki (JP); Taichi Hirano, Nirasaki (JP); Hiromitsu Sasaki, Kurihara-gun (JP); Tetsuo Yoshida, Nirasaki (JP); Michishige Saito, Nirasaki (JP); Hiroyuki Ishihara, Nirasaki (JP); Jun Ooyabu, Nirasaki (JP); Kohji Numata, Kyoto (JP)

(73) Assignee: Tokyo Electron Limited, Tokyo (JP)

( * ) Notice: Subject to any disclaimer, the term of this patent is extended or adjusted under 35 U.S.C. 154(b) by 45 days.

(21) Appl. No.: 13/108,612

(22) Filed: May 16, 2011

(65) Prior Publication Data

US 2011/0214813 A1    Sep. 8, 2011

Related U.S. Application Data

(63) Continuation of application No. 12/607,828, filed on Oct. 28, 2009, now abandoned, which is a continuation of application No. 11/137,673, filed on May 26, 2005, now abandoned, which is a continuation of application No. PCT/JP03/15029, filed on Nov. 25, 2003.

(30) Foreign Application Priority Data

Nov. 26, 2002  (JP) ................................ 2002-341949
Oct. 17, 2003  (JP) ................................ 2003-358432

(51) Int. Cl.
*C23C 16/00*    (2006.01)
*C23F 1/00*     (2006.01)
*H01L 21/306*   (2006.01)

(52) U.S. Cl.
USPC ................................ 156/345.34; 118/723 R

(58) Field of Classification Search
USPC ................................ 156/345.34; 118/723 R
See application file for complete search history.

(56) References Cited

U.S. PATENT DOCUMENTS 5,160,543 A    11/1992  Ishihara et al.
5,580,429 A *  12/1996  Chan et al. ............... 204/192.38

(Continued)

FOREIGN PATENT DOCUMENTS

EP    0 793 254 A2    9/1997
JP    05136098 A      6/1993

(Continued)

OTHER PUBLICATIONS

English translation JP 2001-313286, Segawa, Nov. 2001.*

(Continued)

*Primary Examiner* — Keath Chen

(74) *Attorney, Agent, or Firm* — Oblon, Spivak, McClelland, Maier & Neustadt, L.L.P.

(57) ABSTRACT

A plasma processing method is arranged to supply a predetermined process gas into a plasma generation space in which a target substrate is placed, and turn the process gas into plasma. The substrate is subjected to a predetermined plasma process by this plasma. The spatial distribution of density of the plasma and the spatial distribution of density of radicals in the plasma are controlled independently of each other relative to the substrate by a facing portion opposite the substrate to form a predetermined process state over the entire target surface of the substrate.

17 Claims, 26 Drawing Sheets

(56) References Cited

U.S. PATENT DOCUMENTS

| | | | |
|---|---|---|---|
| 5,683,548 A | 11/1997 | Hartig et al. | |
| 5,707,486 A | 1/1998 | Collins | |
| 5,959,409 A * | 9/1999 | Dornfest et al. | 315/111.21 |
| 6,072,147 A | 6/2000 | Koshiishi et al. | |
| 6,165,311 A | 12/2000 | Collins et al. | |
| 6,239,403 B1 | 5/2001 | Dible et al. | |
| 6,294,026 B1 | 9/2001 | Roithner et al. | |
| 6,417,111 B2 | 7/2002 | Nishikawa et al. | |
| 6,585,851 B1 | 7/2003 | Ohmi et al. | |
| 6,894,245 B2 | 5/2005 | Hoffman et al. | |
| 2001/0015175 A1 | 8/2001 | Masuda et al. | |
| 2001/0023663 A1 * | 9/2001 | Kazumi et al. | 118/722 |
| 2001/0037770 A1 | 11/2001 | Otsubo | |
| 2002/0108933 A1 * | 8/2002 | Hoffman et al. | 219/121.43 |
| 2003/0094238 A1 * | 5/2003 | Strang et al. | 156/345.48 |
| 2003/0201162 A1 | 10/2003 | Liu et al. | |
| 2010/0043974 A1 | 2/2010 | Koshiishi et al. | |

FOREIGN PATENT DOCUMENTS

| | | |
|---|---|---|
| JP | 6-37051 | 2/1994 |
| JP | 10-134995 | 5/1998 |
| JP | 11-260596 | 9/1999 |
| JP | 2000-315682 | 11/2000 |
| JP | 2000-323456 | 11/2000 |
| JP | 2000-323460 | 11/2000 |
| JP | 2001-15495 | 1/2001 |
| JP | 2001-17852 | 1/2001 |
| JP | 2001-313286 | 11/2002 |
| WO | WO 96/19096 | 6/1996 |
| WO | 02/067313 | 8/2002 |

OTHER PUBLICATIONS

English translation JP 2001-017852, Hirose et al. Jan. 2001.*
English Machine Translation of Japanese Kokai 2001-313286 to Segawa. Obtained from http://www19.ipdl.inpit.go.jp/PA1/cgi-bin/PA1INDEX on Dec. 10, 2007.
English Machine Translation of Japanese Kokai 2000-323460 to Hirose. Obtained from http://www19.ipdl.inpit.go.jp/PA1/cgi-bin/PA1INDEX on Dec. 10, 2007.
English Machine Translation of Japanese Kokai 2001-017852 to Ozawa. Obtained from http://www19.ipdl.inpit.go.jp/PA1/cgi-bin/PA1INDEX on Dec. 10, 2007.
Abstract JP 2001-017852 A.
Abstract JP 2000-323460 A.

* cited by examiner

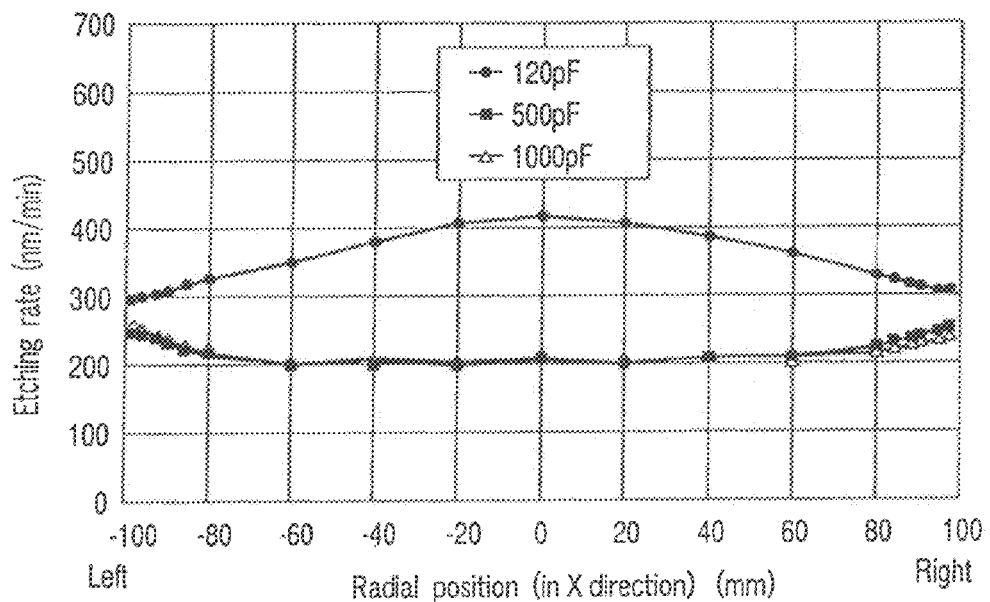
F I G. 7A
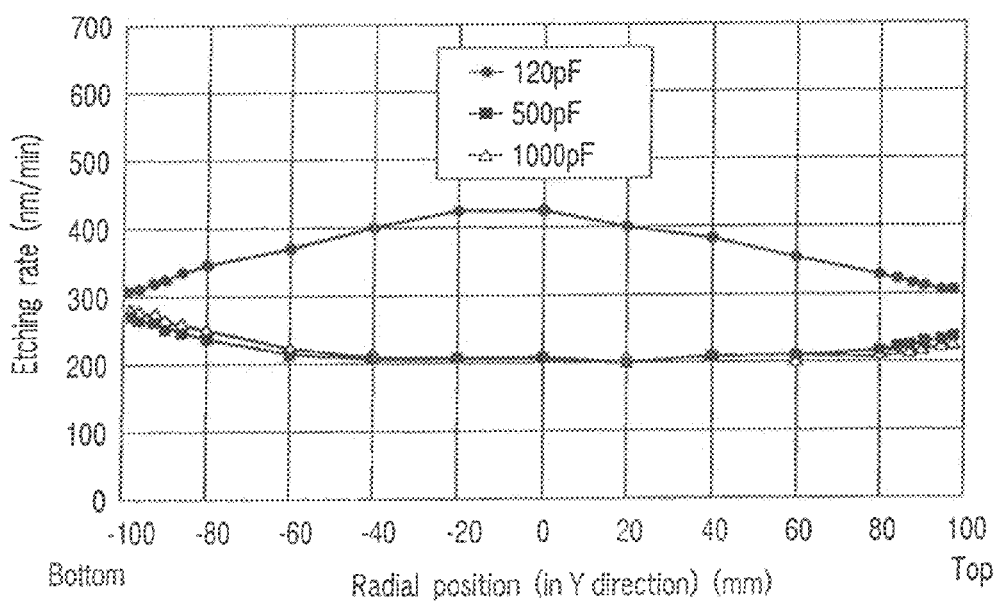
F I G. 7B

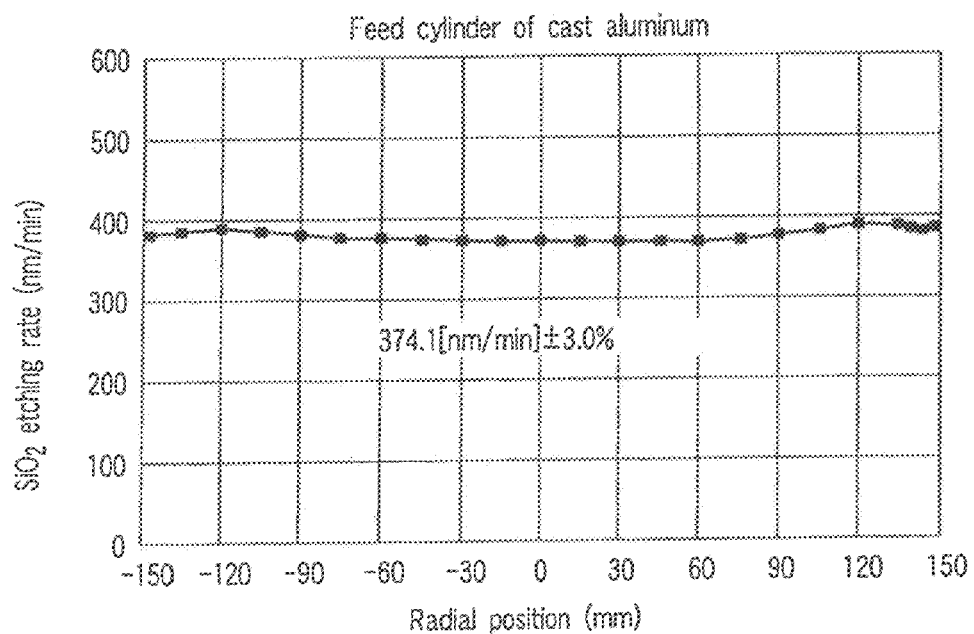
F I G. 9A
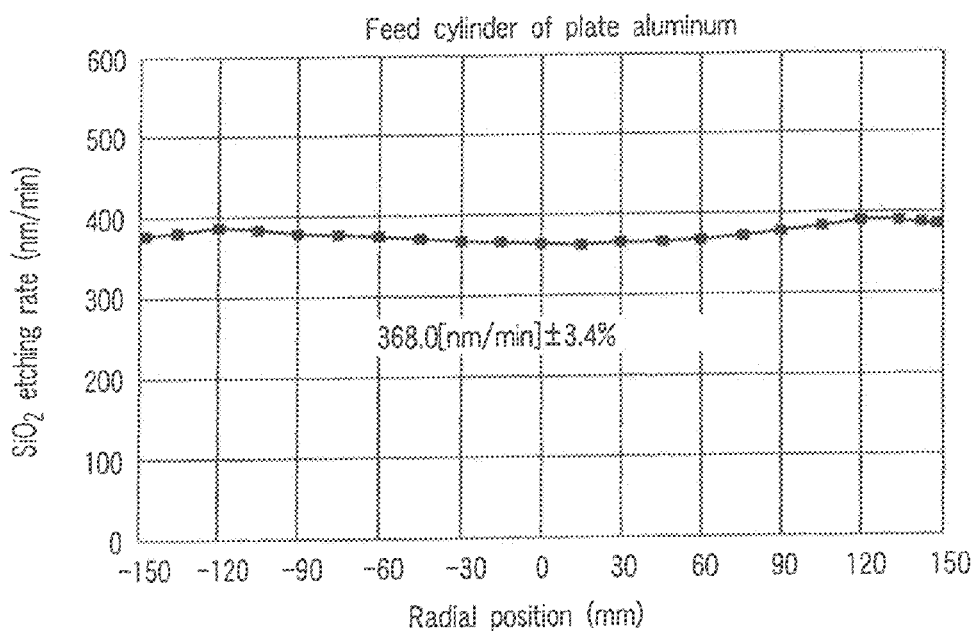
F I G. 9B

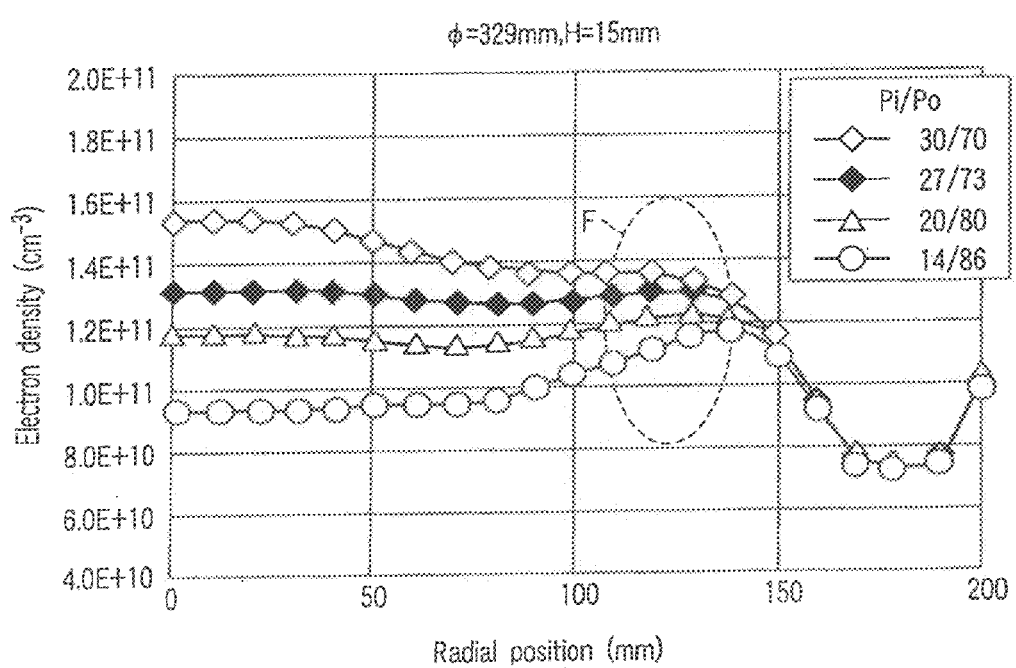
F I G. 19A

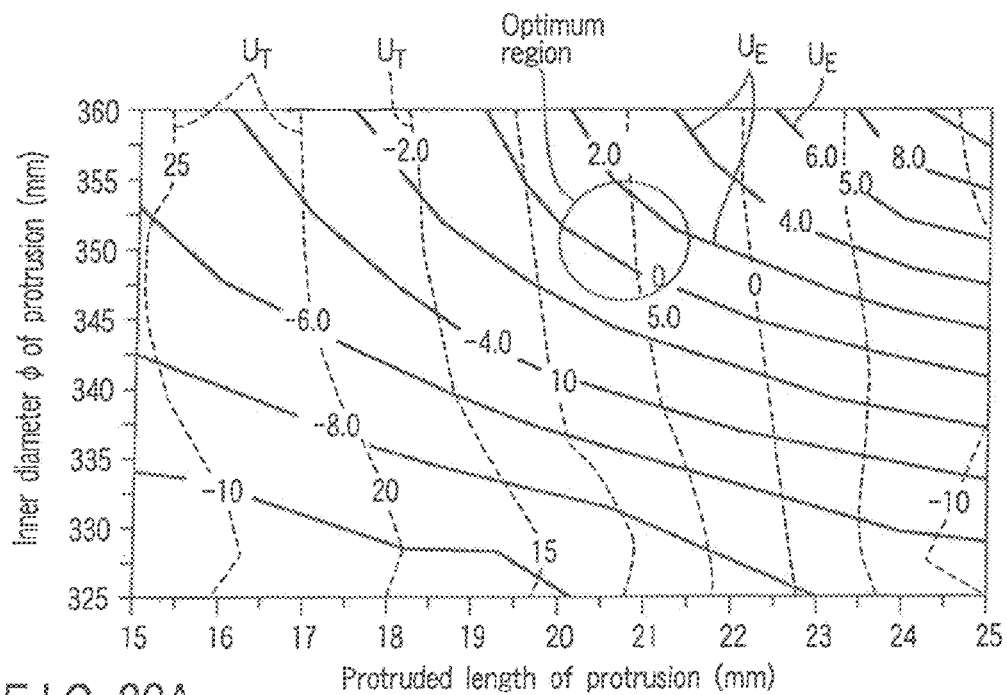
F I G. 20A
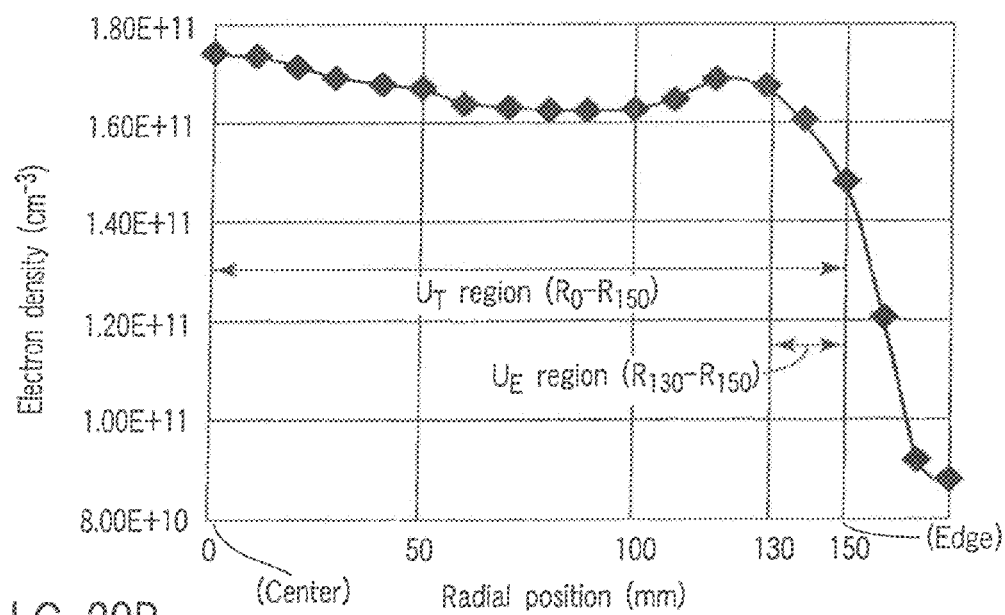
F I G. 20B

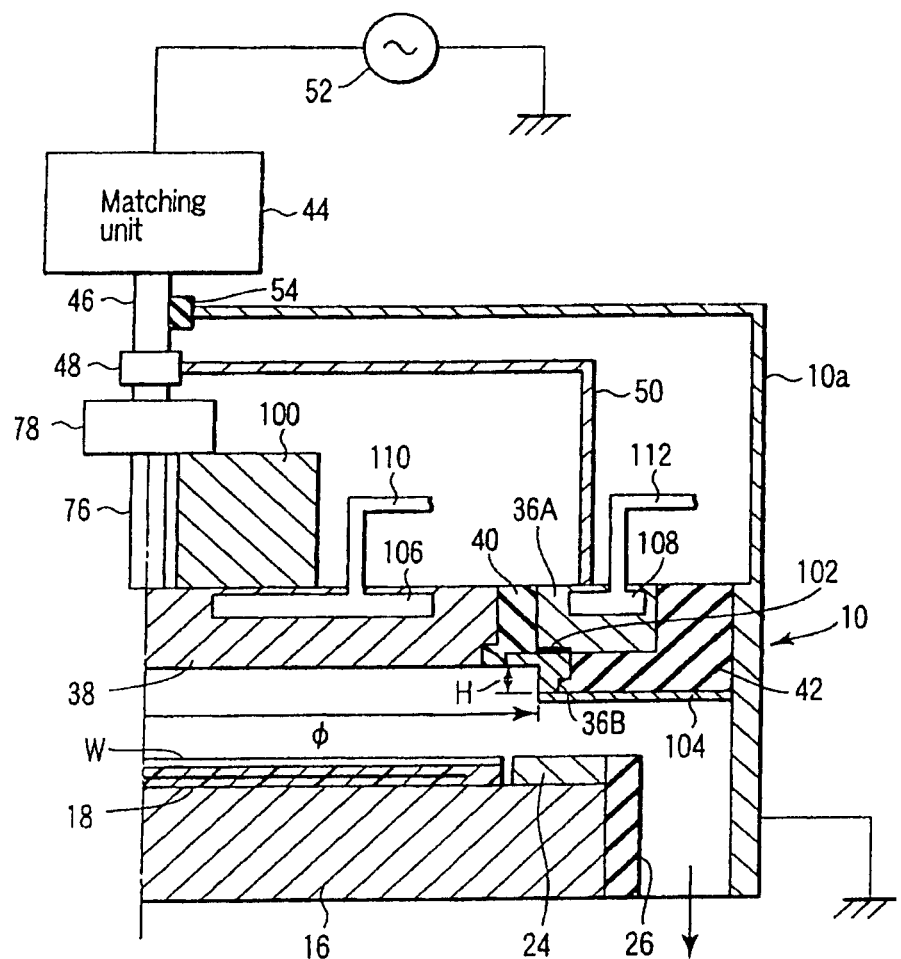
F I G. 21

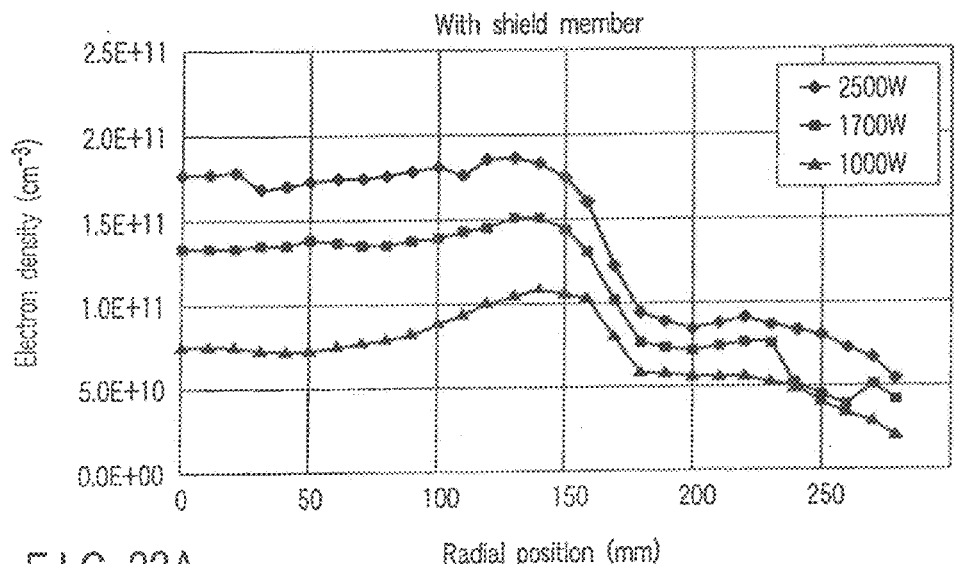
F I G. 22A
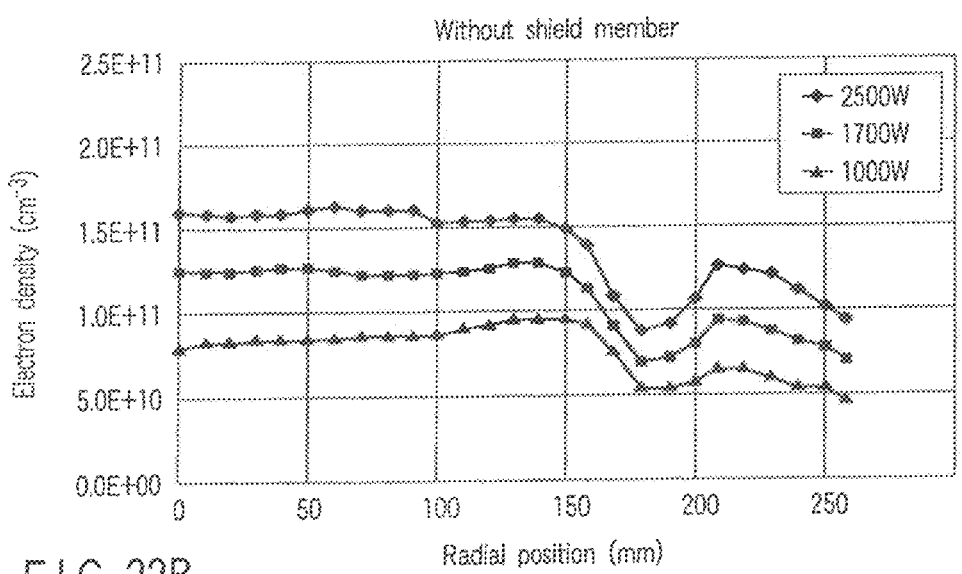
F I G. 22B

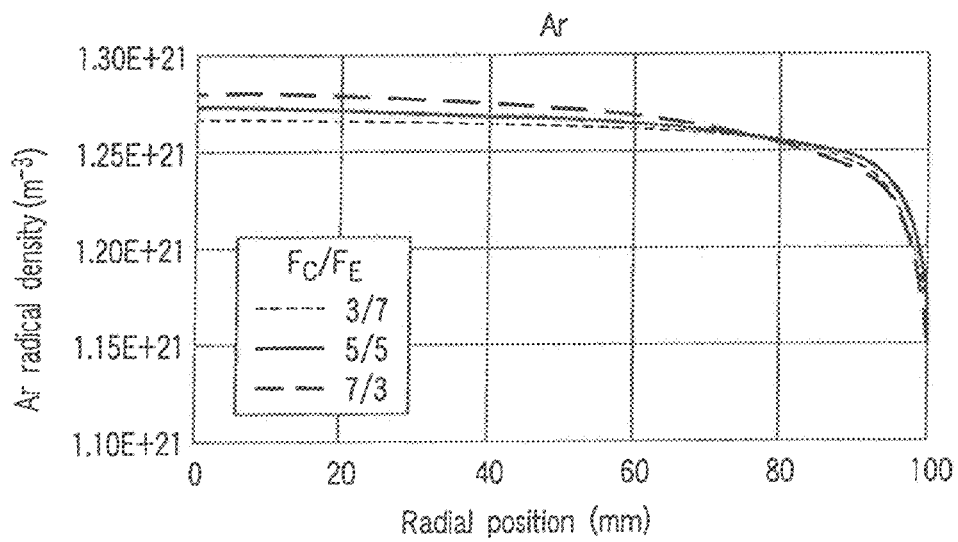
F I G. 27
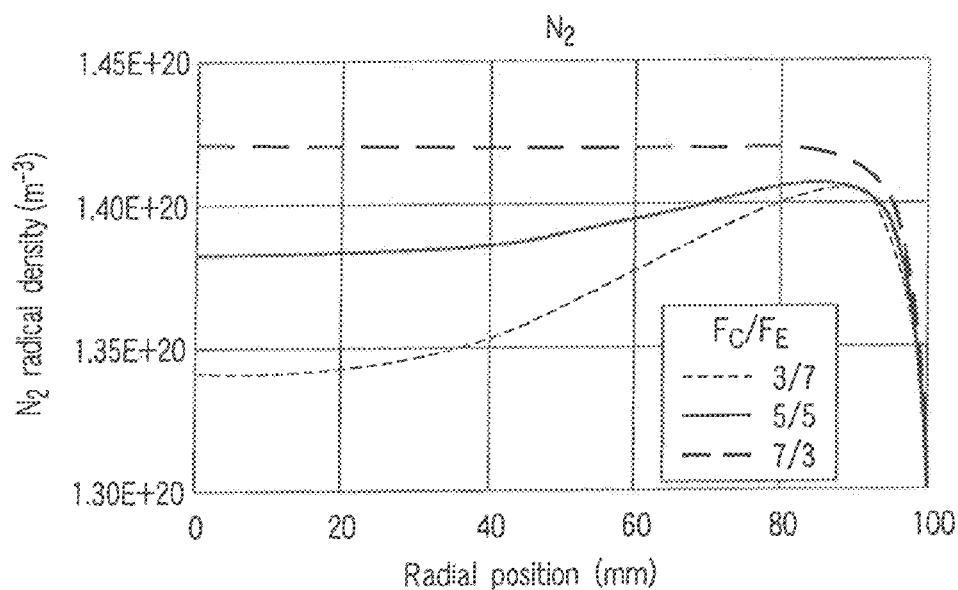
F I G. 28

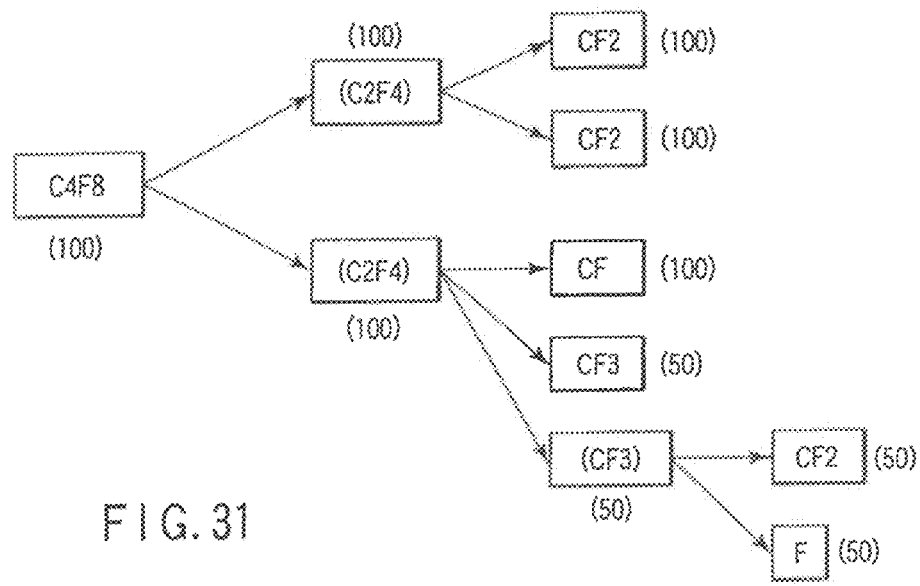
FIG. 31
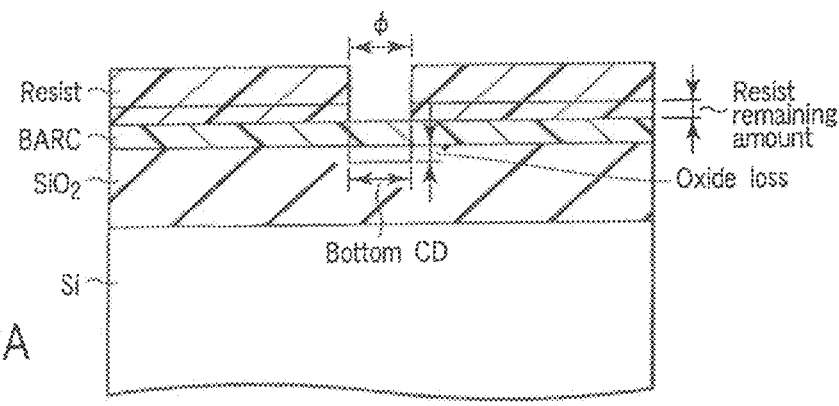
FIG. 32A
FIG. 32B
| | Oxide loss (nm) | Bottom CD (nm) | Resist remaining amount (nm) |
|---|---|---|---|
| Center | 45.2 | 127.4 | 123.3 |
| Edge | 39 | 199 | 216 |
$F_C/F_E = 50/50$ $F_C/F_E=70/30$
| | Oxide loss (nm) | Bottom CD (nm) | Resist remaining amount (nm) |
|---|---|---|---|
| Center | 39 | 125.3 | 216 |
| Edge | 39 | 125.3 | 216 |
F I G. 32C
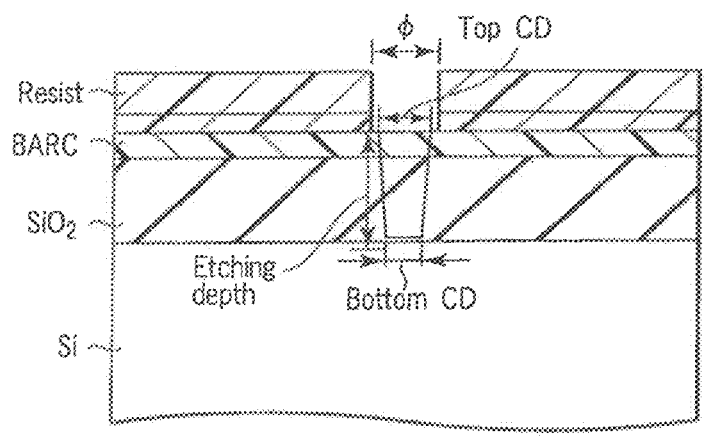
F I G. 33A
$F_C/F_E=50/50$
| | Etching depth (nm) | Top CD (μm) | Bottom CD (μm) | Bottom/ top ratio (%) |
|---|---|---|---|---|
| Center | 861 | 0.186 | 0.107 | 57.5 |
| Edge | 762 | 0.181 | 0.110 | 60.8 |
F I G. 33B $F_C/F_E=10/90$

|  | Etching depth (nm) | Top CD (μm) | Bottom CD (μm) | Bottom/ top ratio (%) |
|---|---|---|---|---|
| Center | 770 | 0.173 | 0.130 | 75.1 |
| Edge | 758 | 0.161 | 0.122 | 75.8 |

PLASMA PROCESSING METHOD AND APPARATUS

CROSS REFERENCE TO RELATED APPLICATIONS

This application is a continuation application of U.S. application Ser. No. 12/607,828, filed Oct. 28, 2009 now abandoned, which is a continuation application of U.S. application Ser. No. 11/137,673, filed May 26, 2005 now abandoned, which is a continuation of PCT Application No. PCT/JP03/15029, filed Nov. 25, 2003, which was published under PCT Article 21(2) in Japanese. U.S. application Ser. No. 11/137,673, is based upon and claims the benefit of priority from prior Japanese Patent Applications No. 2002-341949, filed Nov. 26, 2002; and No. 2003-358432, filed Oct. 17, 2003, the entire contents of both of which and the entire content of U.S. application Ser. Nos. 11/137,673 and 12/607,828, are incorporated herein by reference.

BACKGROUND OF THE INVENTION

1. Field of the Invention

The present invention relates to a technique for subjecting a target substrate to a plasma process, and specifically to a plasma processing technique for processing a substrate, using radicals and ions derived from plasma. Particularly, the present invention relates to a plasma processing technique utilized in a semiconductor process for manufacturing semiconductor devices. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices and FPDs, plasma is often used for processes, such as etching, deposition, oxidation, and sputtering, so that process gases can react well at a relatively low temperature. Parallel-plate plasma processing apparatuses of the capacitive coupling type are in the mainstream of plasma processing apparatuses of the single substrate type.

In general, a parallel-plate plasma processing apparatus of the capacitive coupling type includes a process container or reaction chamber configured to reduce the pressure therein, and an upper electrode and a lower electrode disposed therein in parallel with each other. The lower electrode is grounded and configured to support a target substrate (semiconductor wafer, glass substrate, or the like) thereon. The upper electrode and/or lower electrode are supplied with RF voltage through a matching unit. At the same time, a process gas is delivered from a showerhead provided on the upper electrode side. Electrons are accelerated by an electric field formed between the upper electrode and lower electrode and collide with the process gas, thereby ionizing the gas and generating plasma. Neutral radicals and ions derived from the plasma are used to perform a predetermined micro-fabrication on the surface of the substrate. In the process described above, the two electrodes function to form a capacitor.

The majority of ions in the plasma are positive ions, and the number of positive ions is almost the same as that of electrons. The density of the ions or electrons is far smaller than the density of neutral particles or radicals. In general, plasma etching is arranged to cause radicals and ions to act on the substrate surface at the same time. Radicals perform isotropic etching on the substrate surface by means of chemical reactions. Ions are accelerated by an electric field and vertically incident on the substrate surface, and perform vertical (anisotropic) etching on the substrate surface by means of physical actions.

Conventional plasma processing apparatuses are arranged to cause radicals and ions generated in plasma to act on the substrate surface with the same density distribution. In other words, where the radical density is higher at the substrate central portion than at the substrate peripheral portion, the ion density (i.e., electron density or plasma density) is also higher at the substrate central portion than at the substrate peripheral portion. Particularly, in parallel-plate plasma processing apparatuses described above, if the frequency of the RF applied to the upper electrode is set higher, when the RF is supplied from an RF power supply through a feed rod to the electrode backside, it is transmitted through the electrode surface by means of the skin effect and is concentrated at the central portion of the electrode bottom surface (plasma contact surface). As a consequence, the electric field intensity at the central portion of the electrode bottom surface becomes higher than the electric field intensity at the peripheral portion, so both the radical density and ion density (electron density) become higher at the electrode central portion than at the electrode peripheral portion. However, if radicals and ions are always limited or restricted to such a relationship that they have the same distribution in acting on the substrate surface, it is difficult to perform a predetermined plasma process on the substrate, and it is particularly difficult to improve the uniformity in process state or process result.

BRIEF SUMMARY OF THE INVENTION

An object of the present invention is to provide a plasma processing apparatus and method, which can optimize a plasma process in which radicals and ions act on a target substrate at the same time.

According to a first aspect of the present invention, there is provided a plasma processing method comprising:

exposing a target substrate to plasma of a predetermined process gas; and subjecting the substrate to a predetermined plasma process by the plasma, wherein spatial distribution of density of the plasma and spatial distribution of density of radicals in the plasma are controlled independently of each other relative to the substrate to form a predetermined process state over an entire target surface of the substrate.

According to a second aspect of the present invention, there is provided a plasma processing apparatus arranged to turn a process gas into plasma in a plasma generation space within a process container configured to have a vacuum atmosphere therein, and subject a target substrate placed within the plasma generation space to a predetermined plasma process, the apparatus comprising:

a plasma density control section configured to control spatial distribution of density of the plasma relative to the substrate; and a radical density control section configured to control spatial distribution of density of radicals in the plasma relative to the substrate independently of the plasma density spatial distribution.

According to the first and second aspects, the spatial distribution of plasma density (i.e., electron density or ion density) and the spatial distribution of radical density are controlled independently of each other relative to the target substrate to optimize the balance or synergy between radical base etching and ion base etching.

In order to achieve this, the facing portion opposite the target substrate may comprise first and second RF discharge regions configured to control the plasma density spatial distribution, and first and second process gas delivery regions configured to control the radical density spatial distribution, in layouts independently of each other. In this case, by adjusting the balance (ratio) of the RF electric field intensity or input power between the first and second RF discharge regions, the spatial distribution of plasma density (ion density) can be controlled. Further, by adjusting the balance (ratio) of the gas flow rate between the first and second process gas delivery regions, the spatial distribution of radical density can be controlled. If the first and second RF discharge regions respectively agree with or correspond to the first and second process gas delivery regions, change in the input power ratio affects the spatial distribution of radical density, while change in the gas flow-rate ratio affects the spatial distribution of plasma density (ion density). By contrast, where the division layout of the RF discharge regions and the division layout of the process gas delivery regions are independent of each other, such an interlinking relationship is cut off, so that the plasma density distribution and radical density distribution can be controlled independently of each other.

In one design according to this independent type layout, the facing portion may be divided into two regions as the first and second RF discharge regions on a peripheral side and a central side, respectively, in a radial direction relative to a center through which a vertical line extending from a center of the target substrate passes. Further, the second RF discharge region on the facing portion may be divided into two regions as the first and second process gas delivery regions on a peripheral side and a central side, respectively, in the radial direction. More preferably, the first RF discharge region is disposed radially outside the outer peripheral edge of the target substrate.

With this layout, the control over the plasma density spatial distribution performed by adjusting the ratio of electric field intensity or input power between the first and second RF discharge regions does not have a substantial influence on the control over the radical density spatial distribution performed by adjusting the ratio of process gas flow rate between the first and second process gas delivery regions. Specifically, the process gas delivered from the first and second process gas delivery regions is dissociated within an area corresponding to the second RF discharge region. Thus, where the balance of electric field intensity or input power between the first and second RF discharge regions is changed, the balance of radical generation amount or density between the first and second process gas delivery regions is not substantially affected. As a consequence, the plasma density spatial distribution and radical density spatial distribution can be controlled independently of each other.

In one design, an RF output from a single RF power supply may be divided at a predetermined ratio, and thereby discharged from the first RF discharge region and the second RF discharge region. Further, a process gas supplied from a single process gas supply source may be divided at a predetermined ratio, and thereby delivered from the first process gas delivery region and the second process gas delivery region. In this case, the process gas may be delivered from the first and second process gas delivery regions at substantially deferent flow rates per unit area. Where the process gas is a mixture gas of a plurality of gases, the plurality of gases may be delivered from the first process gas delivery region at a first gas mixture ratio, and the plurality of gases may be delivered from the second process gas delivery region at a second gas mixture ratio different from the first gas mixture ratio.

In one design, processing rates at respective positions on the target surface of the target substrate may be mainly controlled in accordance with the plasma density spatial distribution. Further, one or both of processing selectivity and processing shapes at respective positions on the target surface of the target substrate may be mainly controlled in accordance with the radical density spatial distribution.

In the plasma processing apparatus according to the second aspect, the plasma density control section may comprise an RF distributor configured to divide and transmit an RF with a constant frequency, output from an RF power supply, at a predetermined ratio to the first and second RF discharge regions. The radical density control section may comprise a process gas distributor configured to divide and supply the process gas, output from a process gas supply source, at a predetermined ratio to the first and second process gas delivery regions. In this case, the RF distributor preferably includes an impedance control section configured to variably control one or both of an impedance of a first feed circuit from the RF power supply to the first RF discharge region, and an impedance of a second feed circuit from the RF power supply to the second RF discharge region. The first and second RF discharge regions may respectively comprise first and second electrodes electrically insulated from each other. The first and second process gas delivery regions preferably include a number of process gas delivery holes formed on the second electrode.

According to the first and second aspects, it is possible to optimize a plasma process arranged to cause radicals and ions to act on a target substrate at the same time.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 7A and 7B are graphs showing spatial distribution characteristics of etching rate according to the first embodiment;

FIGS. 9A and 9B are graphs showing spatial distribution characteristics of etching rate according to the second embodiment;

FIGS. 19A to 19E are graphs showing spatial distribution characteristics of electron density, using as parameters the inner diameter and protruded length of an upper electrode protrusion according to the second embodiment;

FIGS. 20A and 20B are graphs showing characteristic lines of electron density uniformity, using as two-dimensional parameters the inner diameter and protruded length of an upper electrode protrusion according to the second embodiment;

FIG. 21 is a sectional side view showing a plasma etching apparatus according to a third embodiment of the present invention;

FIGS. 22A and 22B are graphs showing spatial distribution characteristics of electron density to demonstrate an effect of a shield member according to the third embodiment;

FIG. 27 is a graph showing spatial distribution characteristics of Ar radical density, using center/periphery gas flow-rate ratio as a parameter, according to the fifth embodiment;

FIG. 28 is a graph showing spatial distribution characteristics of $N_2$ radical density, using center/periphery gas flow-rate ratio as a parameter, according to the fifth embodiment;

FIG. 31 is a diagram showing a mechanism of radical generation (dissociation) obtained by a simulation according to the fifth embodiment;

FIGS. 32A to 32C are views showing an examination model for BARC etching and sets of measurement data according to a sixth embodiment of the present invention;

FIGS. 33A to 33C are views showing an examination model for $SiO_2$ etching and sets of measurement data according to a seventh embodiment of the present invention; and FIG. 34 is a diagram showing an application example of independent control over two systems for plasma density distribution and radical density distribution.

DETAILED DESCRIPTION OF THE INVENTION

Figure 1:
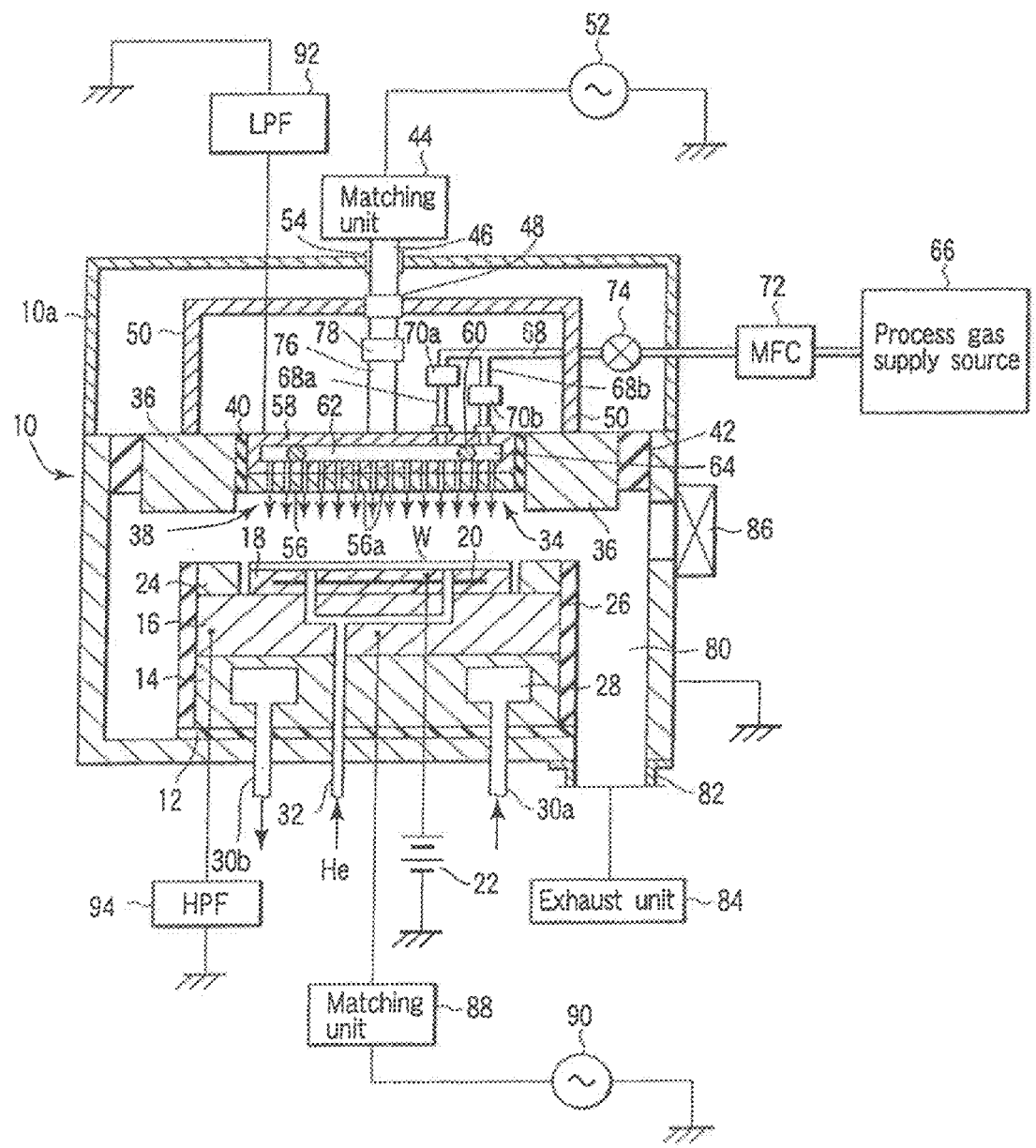
FIG. 1 is a sectional side view showing a plasma etching apparatus according to a first embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

(First Embodiment)

FIG. 1 is a sectional side view showing a plasma etching apparatus according to a first embodiment of the present invention. This plasma etching apparatus is structured as a parallel-plate plasma etching apparatus of the capacitive coupling type. The apparatus includes a cylindrical chamber (process container) 10, which is made of, e.g., aluminum with an alumite-processed (anodized) surface. The chamber 10 is protectively grounded.

A columnar susceptor pedestal 14 is disposed on the bottom of the chamber 10 through an insulating plate 12 made of, e.g., a ceramic. A susceptor 16 made of, e.g., aluminum is disposed on the susceptor pedestal 14. The susceptor 16 is used as a lower electrode, on which a target substrate, such as a semiconductor wafer W, is placed.

The susceptor 16 is provided with an electrostatic chuck 18 on the top, for holding the semiconductor wafer W by an electrostatic attraction force. The electrostatic chuck 18 comprises an electrode 20 made of a conductive film, and a pair of insulating layers or insulating sheets sandwiching the electrode 20. The electrode 20 is electrically connected to a direct-current (DC) power supply 22. With a DC voltage applied from the DC power supply 22, the semiconductor wafer W is attracted and held on the electrostatic chuck 18 by the Coulomb force. A focus ring made of, e.g., silicon is disposed on the top of the susceptor 16 to surround the electrostatic chuck 18 to improve etching uniformity. A cylindrical inner wall member 26 made of, e.g., quartz is attached to the side of the susceptor 16 and susceptor pedestal 14.

The susceptor pedestal 14 is provided with a cooling medium space 28 formed therein and annularly extending therethrough. A cooling medium set at a predetermined temperature, such as cooling water, is circulated within the cooling medium space 28 from a chiller unit (not shown) through lines 30a and 30b. The temperature of the cooling medium is set to control the process temperature of the semiconductor wafer W placed on the susceptor 16. Further, a heat transmission gas, such as He gas, is supplied from a heat transmission gas supply unit (not shown), through a gas supply line 32, into the interstice between the top surface of the electrostatic chuck 18 and the bottom surface of the semiconductor wafer W.

An upper electrode 34 is disposed above the susceptor 16 in parallel with the susceptor. The space between the electrodes 16 and 34 is used as a plasma generation space. The upper electrode 34 defines a surface facing the semiconductor wafer W placed on the susceptor (lower electrode) 16, and thus this facing surface is in contact with plasma generation space. The upper electrode 34 comprises an outer upper electrode 36 and an inner upper electrode 38. The outer upper electrode 36 has a ring shape or doughnut shape and is disposed to face the susceptor 16 at a predetermined distance. The inner upper electrode 38 has a circular plate shape and is disposed radially inside the outer upper electrode 36 while being insulated therefrom. In terms of plasma generation, the outer upper electrode 36 mainly works for it, and the inner upper electrode 38 assists it.

Figure 2:
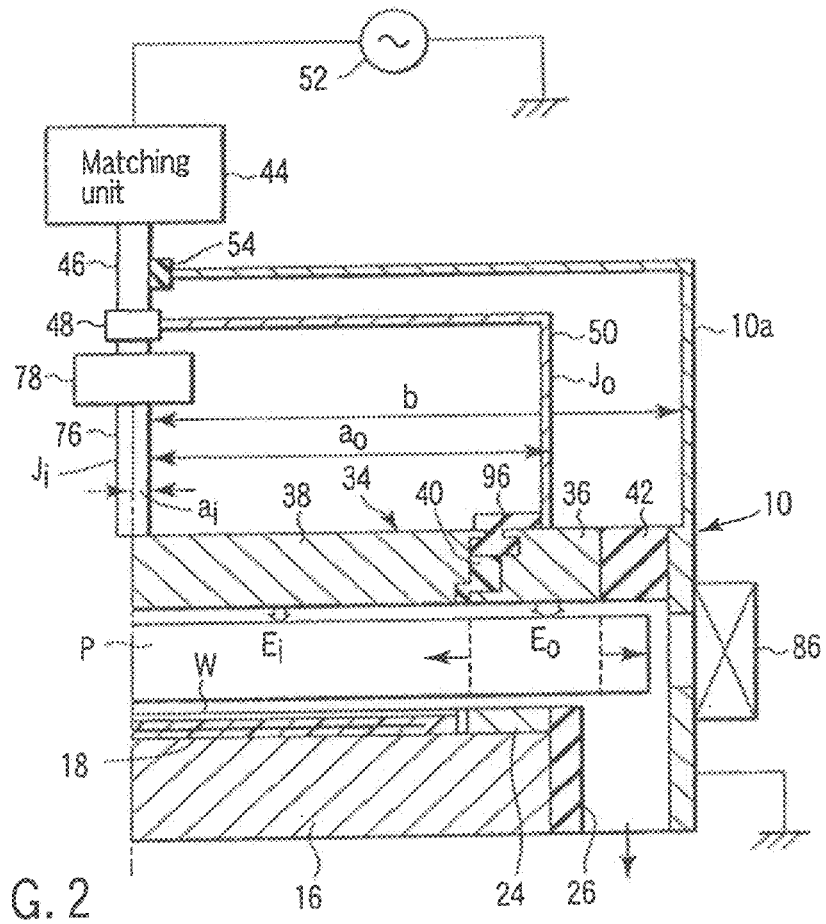
FIG. 2 is an enlarged partial side view showing a main part of the plasma etching apparatus shown in FIG. 1.

FIG. 2 is an enlarged partial side view showing a main part of the plasma etching apparatus shown in FIG. 1. As shown in FIG. 2, the outer upper electrode 36 is separated from the inner upper electrode 38 by an annular gap (slit) of, e.g., 0.25 to 2.0 mm, in which a dielectric body 40 made of, e.g., quartz is disposed. A ceramic body may be disposed in this gap. The two electrodes 36 and 38 with the dielectric body 40 sandwiched therebetween form a capacitor. The capacitance $C_{40}$ of this capacitor is set or adjusted to be a predetermined value, on the basis of the size of the gap and the dielectric constant of the dielectric body 40. An insulating shield member 42 made of, e.g., alumina ($Al_2O_3$) and having a ring shape is airtightly interposed between the outer upper electrode 36 and the sidewall of the chamber 10.

The outer upper electrode 36 is preferably made of a conductor or semiconductor, such as silicon, having a low resistivity to generate a small Joule heat. The outer upper electrode 36 is electrically connected to a first RF power supply 52 through a matching unit 44, an upper feed rod 46, a connector 48, and a feed cylinder 50. The first RF power supply 52 outputs an RF voltage with a frequency of 13.5 MHz or more, such as 60 MHz. The matching unit 44 is arranged to match the load impedance with the internal (or output) impedance of the RF power supply 52. When plasma is generated within the chamber 10, the matching unit 44 performs control for the load impedance and the output impedance of the RF power supply 52 to apparently agree with each other. The output terminal of the matching unit 44 is connected to the top of the upper feed rod 46.

The feed cylinder 50 has a cylindrical or conical shape, or a shape close to it, and formed of a conductive plate, such as an aluminum plate or copper plate. The bottom end of the feed cylinder 50 is connected to the outer upper electrode 36 continuously in an annular direction. The top of the feed cylinder 50 is electrically connected to the bottom of the upper feed rod 46 through the connector 48. Outside the feed cylinder 50, the sidewall of the chamber 10 extends upward above the height level of the upper electrode 34 and forms a cylindrical grounded conductive body 10a. The top of the cylindrical grounded conductive body 10a is electrically insulated from the upper feed rod 46 by a tube-like insulating member 54. According to this design, the load circuit extending from the connector 48 comprises a coaxial path formed of the feed cylinder 50 and outer upper electrode 36 and the cylindrical grounded conductive body 10a, wherein the former members (36 and 50) function as a waveguide.

Returning to FIG. 1, the inner upper electrode 38 includes an electrode plate 56 having a number of gas through-holes 56a, and an electrode support 58 detachably supports the electrode plate 56. The electrode plate 56 is made of a semiconductor material, such as Si or SiC, while the electrode support 58 is made of a conductor material, such as aluminum with an alumite-processed surface. The electrode support 58 has two gas supply cells, i.e., a central gas supply cell 62 and a peripheral gas supply cell 64, formed therein and separated by an annular partition member 60, such as an O-ring. The central gas supply cell 62 is connected to some part of a number of gas delivery holes 56a formed at the bottom surface, so as to constitute a central showerhead. The peripheral gas supply cell 64 is connected to other part of a number of gas delivery holes 56a formed at the bottom surface, so as to constitute a peripheral showerhead.

The gas supply cells 62 and 64 are supplied with a process gas from a common process gas supply source 66 at a predetermined flow-rate ratio. More specifically, a gas supply line 68 is extended from the process gas supply source 66 and divided into two lines 68a and 68b connected to the gas supply cells 62 and 64. The branch lines 68a and 68b are provided with flow control valves 70a and 70b disposed thereon, respectively. The conductance values of the flow passages from the process gas supply source 66 to the gas supply cells 62 and 64 are equal to each other. Accordingly, the flow-rate ratio of the process gas supplied into the two gas supply cells 62 and 64 is arbitrarily adjusted by adjusting the flow control valves 70a and 70b. The gas supply line 68 is provided with a mass-flow controller (MFC) 72 and a switching valve 74 disposed thereon.

The flow-rate ratio of the process gas supplied into the central gas supply cell 62 and peripheral gas supply cell 64 is thus adjusted. As a consequence, the ratio (FC/FE) between the gas flow rate FC from the central showerhead and the gas flow rate FE from the peripheral showerhead is arbitrarily adjusted. As described above, the central showerhead is defined by gas through-holes 56a at the electrode central portion corresponding to the central gas supply cell 62, while the peripheral showerhead is defined by gas through-holes 56a at the electrode peripheral portion corresponding to the peripheral gas supply cell 64. Further, flow rates per unit area may be set different, for the process gas delivered from the central showerhead and peripheral showerhead. Furthermore, gas types or gas mixture ratios are independently or respectively selected, for the process gas delivered from the central showerhead and peripheral showerhead.

The electrode support 58 of the inner upper electrode 38 is electrically connected to the first RF power supply 52 through the matching unit 44, upper feed rod 46, connector 48, and lower feed cylinder 76. The lower feed cylinder 76 is provided with a variable capacitor 78 disposed thereon, for variable adjusting capacitance.

Although not shown, the outer upper electrode 36 and inner upper electrode 38 may be provided with a suitable cooling medium space or cooling jacket (not shown) formed therein. A cooling medium is supplied into this cooling medium space or cooling jacket from an external chiller unit to control the electrode temperature.

An exhaust port 80 is formed at the bottom of the chamber 10, and is connected to an exhaust unit 84 through an exhaust line 82. The exhaust unit 84 includes a vacuum pump, such as a turbo molecular pump, to reduce the pressure of the plasma process space within the chamber 10 to a predetermined vacuum level. A transfer port for a semiconductor wafer W is formed in the sidewall of the chamber 10, and is opened/closed by a gate valve 86 attached thereon.

In the plasma etching apparatus according to this embodiment, the susceptor 16 used as a lower electrode is electrically connected to a second RF power supply 90 through a matching unit 88. The second RF power supply 90 outputs an RF voltage with a frequency of from 2 to 27 MHz, such as 2 MHz. The matching unit 88 is arranged to match the load impedance with the internal (or output) impedance of the RF power supply 90. When plasma is generated within the chamber 10, the matching unit 88 performs control for the load impedance and the internal impedance of the RF power supply 90 to apparently agree with each other.

The inner upper electrode 38 is electrically connected to a low-pass filter (LPF) 92, which prevents the RF (60 MHz) from the first RF power supply 52 from passing through, while it allows the RF (2 MHz) from the second RF power supply 98 to pass through to ground. The low-pass filter (LPF) 92 is preferably formed of an LR filter or LC filter. Alternatively, only a single conductive line may be used for this, because it can give a sufficiently large reactance to the RF (60 MHz) from the first RF power supply 52. On the other hand, the susceptor 16 is electrically connected to a high pass filter (HPF) 94, which allows the RF (60 MHz) from the first RF power supply 52 to pass through to ground.

When etching is performed in the plasma etching apparatus, the gate valve 86 is first opened, and a semiconductor wafer W to be processed is transferred into the chamber 10 and placed on the susceptor 16. Then, an etching gas (typically a mixture gas) is supplied from the process gas supply source 66 into the gas supply cells 62 and 64 at predetermined flow rates and flow-rate ratio. At the same time, the exhaust unit 84 is used to control the pressure inside the chamber 10, i.e., the etching pressure, to be a predetermined value (for example, within a range of from several mTorr to 1 Torr). Further, a plasma generation RF (60 MHz) is applied from the first RF power supply 52 to the upper electrode 34 (36 and 38) at a predetermined power, while an RF (2 MHz) is applied from the second RF power supply 90 to the susceptor 16 at a predetermined power. Furthermore, a DC voltage is applied from the DC power supply 22 to the electrode 20 of the electrostatic chuck 18 to fix the semiconductor wafer W on the susceptor 16. The etching gas delivered from the gas through-holes 56a of the inner upper electrode 38 is turned into plasma by glow discharge between the upper electrode 34 (36 and 38) and susceptor 16. Radicals and ions generated in this plasma are used to etch the target surface of the semiconductor wafer W.

In this plasma etching apparatus, the upper electrode 34 is supplied with an RF within a range covering higher frequencies (form 5 to 10 MHz or more at which ions cannot follow). As a consequence, the plasma density is increased with a preferable dissociation state, so that high density plasma is formed even under a low pressure condition.

In the upper electrode 34, the inner upper electrode 38 is also used as a showerhead directly across the semiconductor wafer W, such that the flow-rate ratio of the gas delivered from the central showerhead (62 and 56a) and peripheral showerhead (64 and 56a) can be arbitrarily adjusted. As a consequence, the spatial distribution of gas molecular or radical density can be controlled in the radial direction, so as to arbitrarily control the spatial distribution of an etching characteristic on the basis of radicals.

Further, as described later, the upper electrode 34 is operated as an RF electrode for plasma generation, such that the outer upper electrode 36 mainly works for it, and the inner upper electrode 38 assists it. The ratio of electric field intensity applied to electrons below the RF electrodes 36 and 38 can be adjusted by these electrodes. As a consequence, the spatial distribution of plasma density can be controlled in the radial direction, so as to arbitrarily and finely control the spatial distribution of a reactive ion etching characteristic.

It should be noted here that the control over the spatial distribution of plasma density has substantially no influence on the control over the spatial distribution of radical density. The control over the spatial distribution of plasma density is performed by varying the ratio of electric field intensity or input power between the outer upper electrode 36 and inner upper electrode 38. On the other hand, the control over the spatial distribution of radical density is performed by varying the ratio of process gas flow rate, gas density, or gas mixture between the central showerhead (62 and 56a) and peripheral showerhead (64 and 56a).

The process gas delivered from the central showerhead (62 and 56a) and peripheral showerhead (64 and 56a) is dissociated in an area directly below the inner upper electrode 38. Accordingly, even if the balance of electric field intensity between the inner upper electrode 38 and outer upper electrode 36 is changed, it does not have a large influence on the balance of radical generation amount or density between the central showerhead (62 and 56a) and peripheral showerhead (64 and 56a), because both showerheads belong to the inner upper electrode 38 (within the same area). Thus, the spatial distribution of plasma density and the spatial distribution of radical density can be controlled substantially independently of each other.

Further, the plasma etching apparatus is arranged such that most or the majority of plasma is generated directly below the outer upper electrode 36, and then diffuses to the position directly below the inner upper electrode 38. According to this arrangement, the showerhead or inner upper electrode 38 is less attacked by ions from the plasma. This effectively prevents the gas delivery ports 56a of the electrode plate 56 from being progressively sputtered, thereby remarkably prolonging the service life of the electrode plate 56, which is a replacement part. On the other hand, the outer upper electrode 36 has no gas delivery ports at which electric field concentration occurs. As a consequence, the outer upper electrode 36 is less attacked by ions, and thus there arises no such a problem in that the outer upper electrode 36 shortens the service life in place of the inner upper electrode 38.

Figure 3:
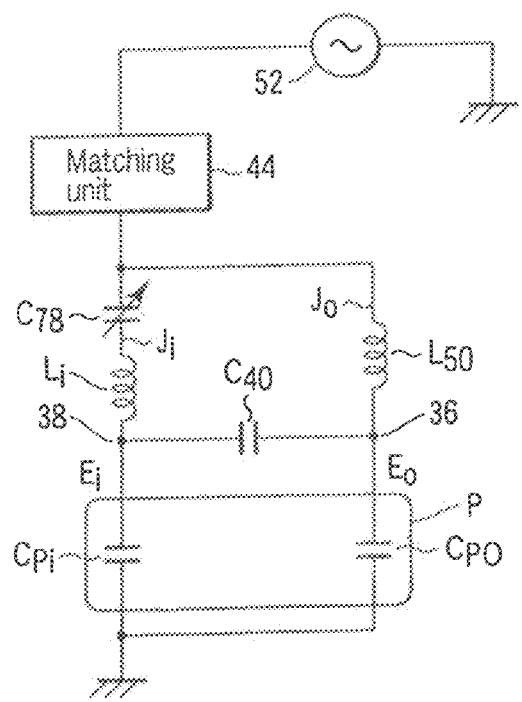
FIG. 3 is a circuit diagram showing an equivalent circuit of a main part of plasma generating means according to the first embodiment.

As described above, FIG. 2 shows a main part of the plasma etching apparatus (particularly, a main part of plasma generating means). In FIG. 2, the structure of the showerheads (56a, 62, and 64) of the inner upper electrode 38 is not shown. FIG. 3 is a circuit diagram showing an equivalent circuit of a main part of plasma generating means according to the first embodiment. In this equivalent circuit, the resistance of respective portions is not shown.

In this embodiment, as described above, the load circuit extending from the connector 48 comprises a coaxial path formed of the outer upper electrode 36 and feed cylinder 50 and the cylindrical grounded conductive body 10a, wherein the former members (36 and 50) function as a waveguide $J_0$. Where the radius (outer radius) of the feed cylinder 50 is $a_0$, and the radius of the cylindrical grounded conductive body 10a is b, the characteristic impedance or inductance $L_0$ of this coaxial path is approximated by the following formula (1).

$$L_0 = K \times \ln(b/a_0) \qquad (1)$$

In this formula, K is a constant determined by the mobility and dielectric constant of a conductive path.

On the other hand, the load circuit extending from the connector 48 also comprises a coaxial path formed of the lower feed rod 76 and the cylindrical grounded conductive body 10a, wherein the former member (76) functions as a waveguide $J_i$. Although the inner upper electrode 38 is present on the extension of the lower feed rod 76, the impedance of lower feed rod 76 is dominant, because the difference in diameters between them is very large. Where the radius (outer radius) of the lower feed rod 76 is $a_i$, the characteristic impedance or inductance $L_i$ of this coaxial path is approximated by the following formula (2).

$$L_i = K \times \ln(b/a_i) \qquad (2)$$

As could be understood from the above formulas (1) and (2), the inner waveguide $J_i$ for transmitting RF to the inner upper electrode 38 provides an inductance $L_i$ in the same manner as a conventional ordinary RF system. On the other hand, the outer waveguide $J_0$ for transmitting RF to the outer upper electrode 36 provides a very small inductance $L_0$ because of a very large radius. As a consequence, in the load circuit extending from the connector 48 toward the side opposite to the matching unit 44, RF is transmitted more easily through the outer waveguide $J_0$ having a lower impedance (a smaller voltage drop). The outer upper electrode 36 is thereby supplied with a larger RF power $P_0$, so the electric field intensity $E_0$ obtained at the bottom surface (plasma contact surface) of the outer upper electrode 36 becomes higher. On the other hand, RF is transmitted less easily through the inner waveguide $J_i$ having a higher impedance (a larger voltage drop). The inner upper electrode 38 is thus supplied with an RF power $P_i$ smaller than the RF power $P_0$ supplied to the inner upper electrode 38, so the electric field intensity $E_i$ obtained at the bottom surface (plasma contact surface) of the inner upper electrode 38 becomes lower than the electric field intensity $E_0$ on the outer upper electrode 36 side.

As described above, according to this upper electrode 34, electrons are accelerated by a stronger electric field $E_0$ directly below the outer upper electrode 36, while electrons are accelerated by a weaker electric field $E_0$ directly below the inner upper electrode 38. In this case, most or the majority of plasma P is generated directly below the outer upper electrode 36, while a subsidiary part of the plasma P is generated directly below the inner upper electrode 38. Then, the high density plasma generated directly below the outer upper electrode 36 diffuses radially inward and outward, so the plasma density becomes more uniform in the radial direction within the plasma process space between the upper electrode 34 and susceptor 16.

Incidentally, in the coaxial path formed of the outer upper electrode 36 and feed cylinder 50 and the cylindrical grounded conductive body 10a, the maximum transmission power Pmax depends on the radius $a_0$ of the feed cylinder 50 and the radius b of the cylindrical grounded conductive body 10a, and is given by the following formula (3).

$$Pmax/E_0^2 max = a_0^2 [\ln(b/a_0)]^2 / 2z_0 \qquad (3)$$

In the above formula, $z_0$ is the input impedance of this coaxial path viewing from the matching unit 44, and $E_0$max is the maximum electric field intensity of the RF transmission system.

In the formula (3), the maximum transmission power Pmax takes on the maximum value when $(b/a_0) \approx 1.65$. In other words, when the ratio $(b/a_0)$ of the radius of the cylindrical grounded conductive body 10a relative to the radius of the feed cylinder 50 is about 1.65, the power transmission efficiency of the outer waveguide $J_0$ is best. Accordingly, in order to improve the power transmission efficiency of the outer waveguide $J_0$, the radius of the feed cylinder 50 and/or the radius of the cylindrical grounded conductive body 10a are selected so that the ratio $(b/a_0)$ is preferably set to be at least within a range of from 1.2 to 2.0, and more preferably within a range of 1.5 to 1.7.

According to this embodiment, the lower feed rod 76 is provided with the variable capacitor 78 disposed thereon as means for adjusting the ratio or balance between the outer electric field intensity $E_0$ directly below the outer upper electrode 36 (or the input power $P_0$ into the outer upper electrode 36 side) and the inner electric field intensity $E_i$ directly below the inner upper electrode 38 (or the input power $P_i$ into the inner upper electrode 38 side), in order to arbitrarily and finely control the spatial distribution of plasma density. The capacitance $C_{78}$ of the variable capacitor 78 is adjusted to increase or decrease the impedance or reactance of the inner waveguide $J_i$, thereby changing the relative ratio between the voltage drop through the outer waveguide $J_0$ and the voltage drop through the inner waveguide $J_i$. As a consequence, it is possible to adjust the ratio between the outer electric field intensity $E_0$ (outer input power $P_0$) and the inner electric field intensity $E_i$ (inner input power $P_i$).

In general, the ion sheath impedance that causes an electric potential drop of plasma is capacitive. In the equivalent circuit shown in FIG. 3, it is assumed (constructed) that the sheath impedance capacitance directly below the outer upper electrode 36 is $C_{po}$, and the sheath impedance capacitance directly below the inner upper electrode 38 is $C_{pi}$. Further, the capacitance $C_{40}$ of the capacitor formed between the outer upper electrode 36 and inner upper electrode 38 cooperates with the capacitance $C_{78}$ of the variable capacitor 78 in changing the balance between the outer electric field intensity $E_0$ (outer input power $P_0$) and inner electric field intensity $E_i$ (inner input power $P_i$). The capacitance $C_{40}$ can be set or adjusted to optimize the variable capacitor's 78 function of adjusting the balance of electric field intensity (input power).

Figure 4:
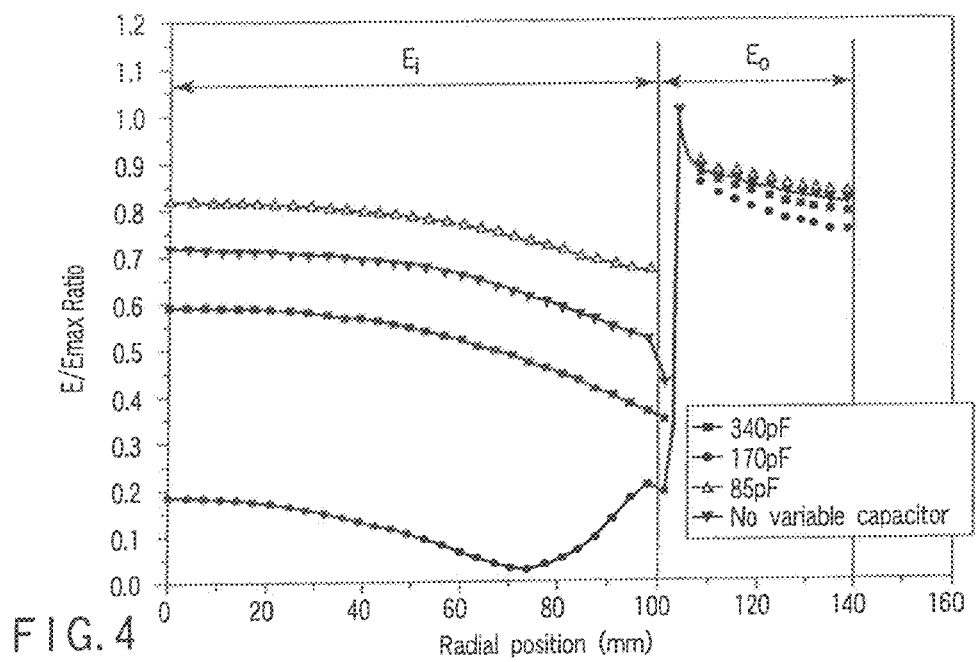
FIG. 4 is a graph showing distribution characteristics of electric field intensity (relative value), obtained by a function of adjusting the balance of electric field intensity according to the first embodiment.
Figure 5:
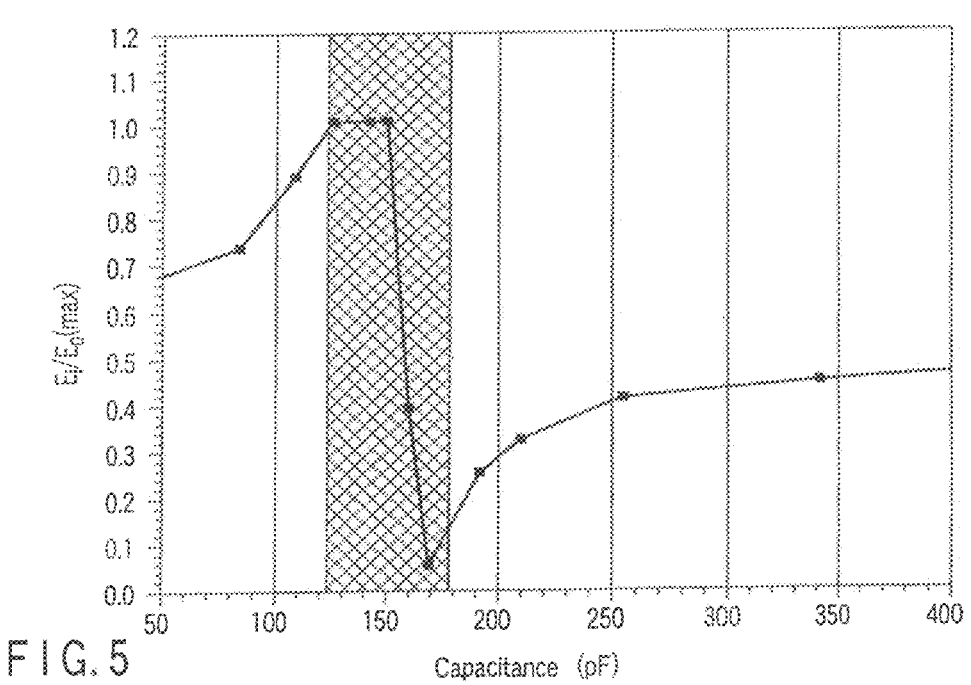
FIG. 5 is a graph showing ratio characteristics of electric field intensity, obtained by a function of adjusting the balance of electric field intensity according to the first embodiment.

FIGS. 4 and 5 show test examples (simulation data) in relation to the variable capacitor's 78 function of adjusting the balance of electric field intensity according to this embodiment. FIG. 4 shows distribution characteristics of electric field intensity (relative value) in the radial direction of the electrode, using the capacitance $C_{78}$ of the variable capacitor 78 as a parameter. FIG. 5 shows the relative ratio between the outer electric field intensity $E_0$ and inner electric field intensity $E_i$, using the capacitance $C_{78}$ of the variable capacitor 78 as a parameter.

In this simulation, the diameter of the semiconductor wafer W was set at 200 mm, the radius of the inner upper electrode 38 (with a circular plate shape) at 100 mm, and the inner radius and outer radius of the outer upper electrode 36 (with a ring shape) at 101 mm and 141 mm, respectively. In this case, the area of the semiconductor wafer W was 314 cm², the area of the inner upper electrode 38 was 314 cm² the same as that of the wafer W, and the area of the outer upper electrode 36 was 304 cm² slightly smaller than that of the wafer W. Typically, on the face opposite the wafer. W, the planar area of the outer upper electrode 36 is preferably set to be about ¼ times to about 1 times the planar area of the inner upper electrode 38.

As shown in FIG. 4, the outer electric field intensity $E_0$ directly below the outer upper electrode 36 is higher than the inner electric field intensity $E_i$ directly below the inner upper electrode 38, and a large step of electric field intensity is thereby formed near the boundary between the electrodes 36 and 38. Particularly, the outer electric field intensity $E_0$ directly below the outer upper electrode 36 is apt to take on the maximum value near the boundary abutting the inner upper electrode 38, and gradually decrease radially outward therefrom. In this example, as shown in FIG. 5, where the capacitance $C_{78}$ of the variable capacitor 78 is changed within a range of from 180 to 350 pF, the ratio $E_i/E_0$ between the electric field intensities $E_i$ and $E_0$ can be continuously controlled within a range of from about 10 to 40%. Where $C_{78}$ falls within a range of from 125 to 180 pF, the load circuit produces resonance and thereby becomes uncontrollable. In principle, within a stable domain, where the capacitance $C_{78}$ of the variable capacitor 78 is increased, the reactance of the inner waveguide $J_i$ decreases. As a consequence, the inner electric field intensity $E_i$ directly below the inner upper electrode 38 is relatively increased, so that the ratio $E_i/E_0$ between the outer electric field intensity $E_0$ and inner electric field intensity $E_i$ is set to be higher.

According to this embodiment, the reactance of the outer waveguide $J_0$ provided by the feed cylinder 50 can be very small, so the impedance reactance of the load circuit, viewing from the output terminal of the matching unit 44, takes on a capacitive negative value. This means that there is no resonance point at which reactance causes polar inversion from an inductive positive value to a negative value, on the waveguide extending from the output terminal of the matching unit 44 to the capacitive ion sheath. Since no resonance point is formed, no resonance electric current is generated, thereby reducing the RF energy loss and ensuring stable control of the plasma density distribution.

Figure 6A:
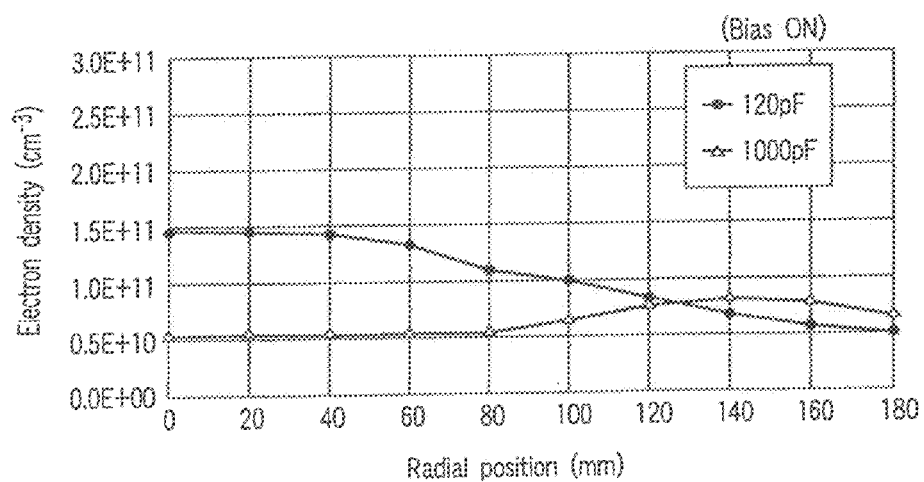
FIGS. 6A and 6B are graphs showing spatial distribution characteristics of electron density according to the first embodiment.

FIGS. 6A (bias in the ON-state), 6B (bias in the OFF-state), 7A (in the X direction), and 7B (in the Y direction) show examples (experimental data) concerning electron density distribution characteristics and etching rate distribution characteristics, obtained by the plasma etching apparatus according to this embodiment. In this experiment, as in the electric field intensity distribution characteristics shown in FIGS. 4 and 5, the capacitance $C_{78}$ of the variable capacitor 78 was used as a parameter. The electron density was measured at positions in the radial direction, using a plasma absorption probe (PAP). Further, a silicon oxide film disposed on a semiconductor wafer was etched, and the etching rate was measured at wafer positions in the radial direction. Also in this experiment, the radius of the inner upper electrode 38 was set at 100 mm, and the inner radius and outer radius of the outer upper electrode 36 (with a ring shape) at 101 mm and 141 mm, respectively. Principal etching conditions were as follows:

Wafer diameter=200 mm;
Pressure inside the chamber=15 mTorr;
Temperature (upper electrode/chamber sidewall/lower electrode)=60/50/20° C.;
Heat transmission gas (He gas) supply pressure (central portion/edge portion)=15/25 Torr;
Distance between the upper and lower electrodes=50 mm;
Process gas ($C_5F_8$/Ar/$O_2$) flow rate≈20/380/20 sccm; and
RF power (60 MHz/2 MHz)≈2200 W/1500 W ($C_{78}$=500 pF, 1000 pF), 1800 W ($C_{78}$=120 pF).

Figure 6B:
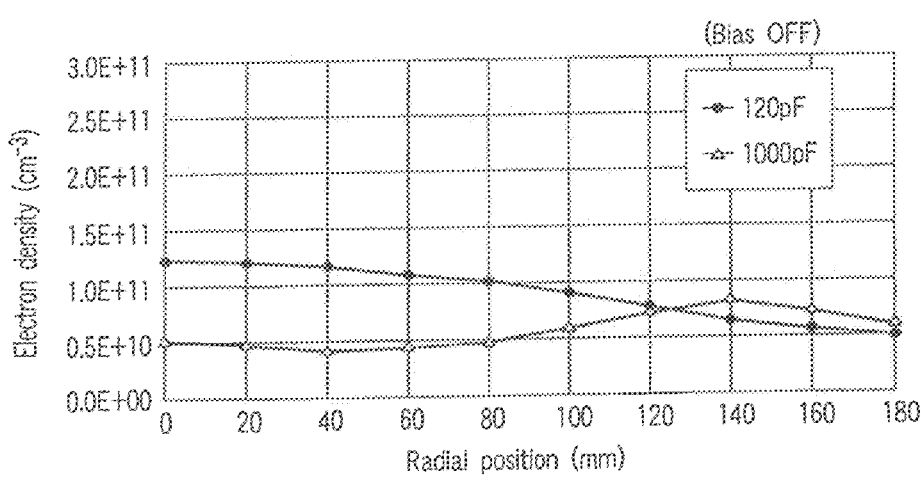

Referring to FIGS. 6A and 6B, the capacitance $C_{78}$ of the variable capacitor 78 was set at 120 pF so that the ratio $E_i/E_0$ between the outer electric field intensity $E_0$ and inner electric field intensity $E_i$ was set to be higher. In this case, the distribution characteristic of electron density or plasma density was formed such that the density took on the maximum value near the electrode center, and monotonously decreased radially outward therefrom. It is thought that, in this case, the plasma diffusion rate overcame the difference between the plasma generation rate directly below the outer upper electrode 36 or the main plasma generation section, and the plasma generation rate directly below the inner upper electrode 38 or sub plasma generation section. As a consequence, the plasma gathered to the central portion from all around, and the plasma density was thereby higher at the central portion than at the peripheral portion.

On the other hand, the capacitance $C_{78}$ of the variable capacitor 78 was set at 1000 pF so that the ratio $E_i/E_0$ between the outer electric field intensity $E_0$ and inner electric field intensity $E_i$ was set to be lower. In this case, the distribution characteristic of electron density was formed such that the density took on the maximum value on the outer side (near a position 140 mm distant from the center) of the wafer rather than the inner side in the radial direction, and became almost uniform on the inner side (0 to 100 mm) of the wafer. It is thought that, this was so because the plasma generation rate directly below the inner upper electrode 38 increased, and plasma diffusion radially outward was thereby enhanced. In any case, the spatial distribution characteristic of electron density or plasma density can be flexibly and finely controlled by finely adjusting the capacitance $C_{78}$ of the variable capacitor 78 within a suitable range.

Further, the electron density at respective positions was higher to some extent in the case (FIG. 6A) with an RF bias (2 MHz) applied to the lower electrode 16, as compared to the case (FIG. 6B) without any RF bias applied to the lower electrode 16. However, their distribution patterns were almost the same.

Referring to the experimental data shown in FIGS. 7A and 7B, different patterns of the spatial distribution characteristic of etching rate were formed by adjusting the capacitance $C_{78}$ of the variable capacitor 78, in accordance with the spatial distribution characteristics of electron density shown in FIGS. 6A and 6B. Accordingly, the spatial distribution characteristic of etching rate on the wafer surface can be flexibly and finely controlled by finely adjusting the capacitance $C_{78}$ of the variable capacitor 78 within a suitable range.

Further, in the plasma etching apparatus according to this embodiment, the flow-rate ratio of the gas delivered from the central portion and peripheral portion can be adjusted by the showerhead mechanism of the inner upper electrode 36, as described above. This function allows the spatial distribution characteristic of etching rate to be controlled on the basis of radicals.

(Second Embodiment)

Figure 8:
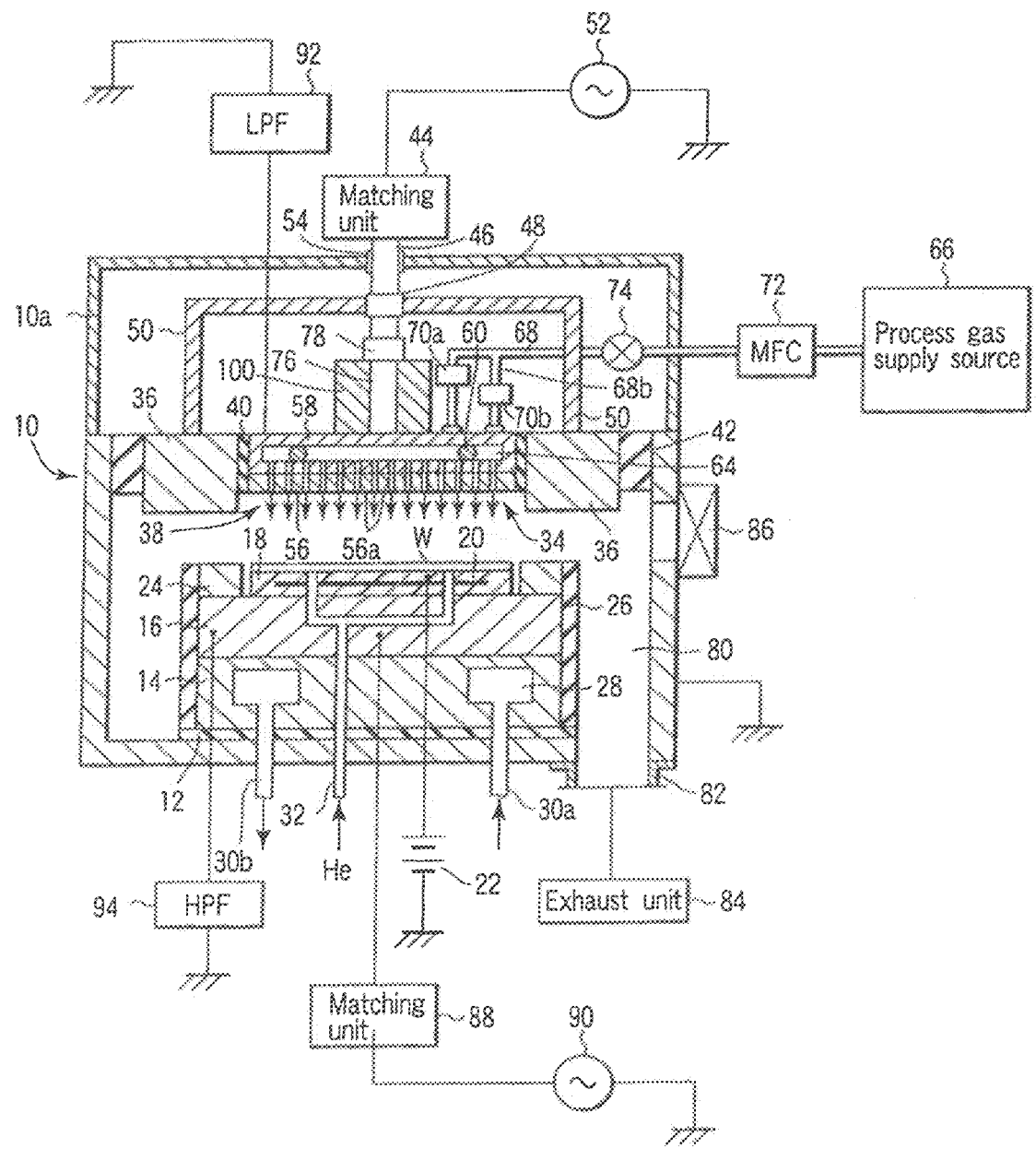
FIG. 8 is a sectional side view showing a plasma etching apparatus according to a second embodiment of the present invention.

FIG. 8 is a sectional side view showing a plasma etching apparatus according to a second embodiment of the present invention. In FIG. 8, the constituent elements having substantially the same arrangement and function as those of the apparatus according to the first embodiment (FIG. 1) are denoted by the same reference numerals.

One of the features of the second embodiment resides in that the feed cylinder 50 or transmission path for transmitting the RF from the RF power supply 52 to the outer upper electrode 36 is made of a cast metal. This cast metal is preferably a metal having a high conductivity and workability, such as aluminum. As one of the advantages, cast metals can realize a low cost, and thus reduce the cost for the member to ½ or less of that provided by a plate material. As another advantage, cast metals can be easily integrated, and thus can reduce the number of RF connection surfaces in the member, thereby reducing the RF loss.

Figure 10A:
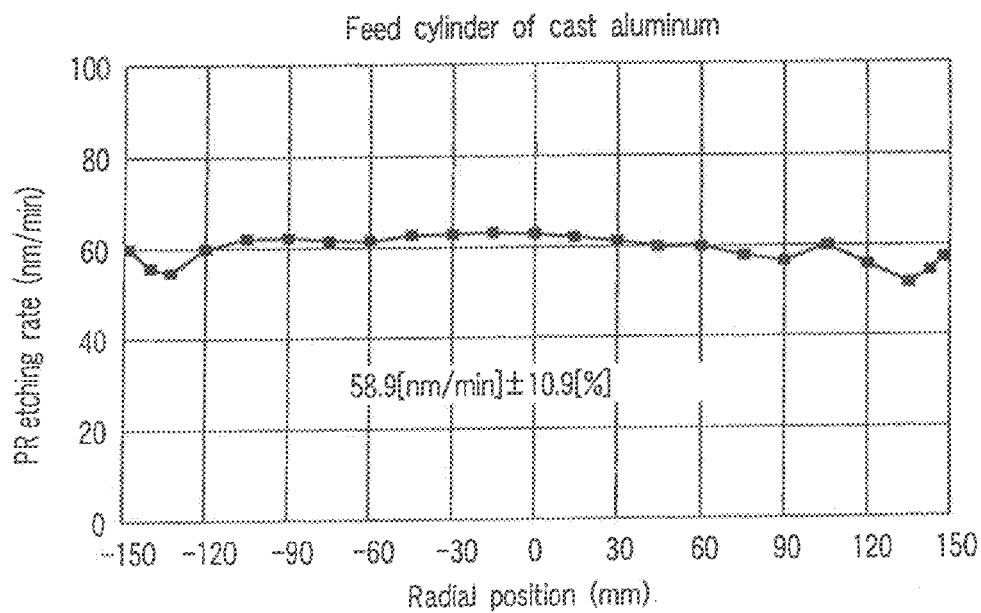
FIGS. 10A and 10B are graphs showing spatial distribution characteristics of etching rate according to the second embodiment.
Figure 10B:
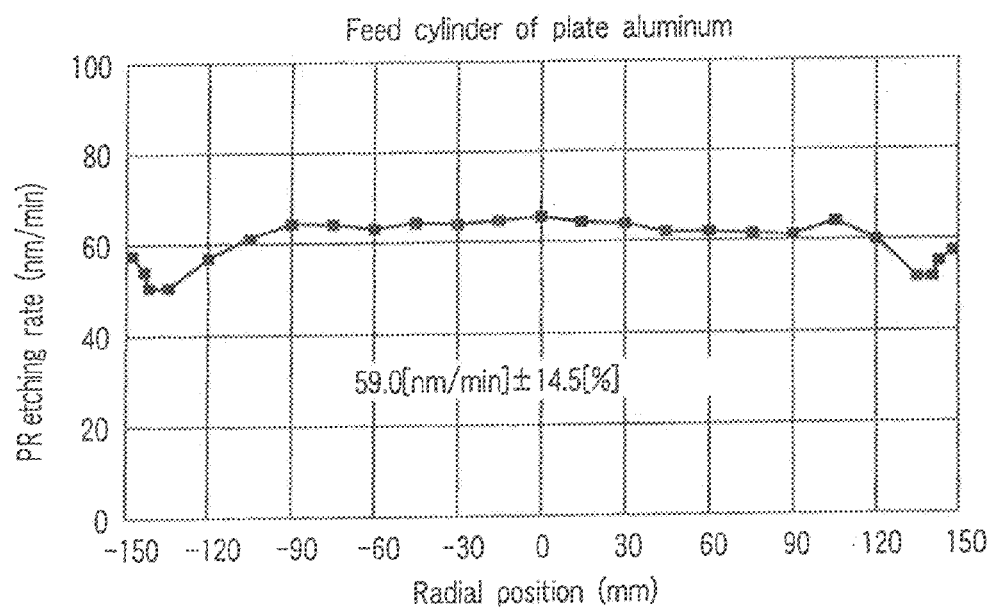

Further, even where the feed cylinder 50 is made of a cast metal, the RF transmission efficiency is not lowered. Specifically, referring to the experimental data shown in FIGS. 9A (cast metal), 9B (plate), 10A (cast metal), and 10B (plate), there was no substantial difference in etching rate between the case where the feed cylinder 50 was made of a plate material, and the case where the feed cylinder 50 was made of a cast metal. FIGS. 9A and 9B show spatial distribution characteristics of etching rate over a silicon oxide film ($SiO_2$). FIGS. 10A and 10B show spatial distribution characteristics of etching rate over a photo-resist (PR) film. In this test example, principal etching conditions were as follows:

Wafer diameter=300 mm;
Pressure inside the chamber=25 mTorr;
Temperature (upper electrode/chamber sidewall/lower electrode)=60/60/20° C.;
Heat transmission gas (He gas) supply pressure (central portion/edge portion)=15/40 Torr;
Distance between the upper and lower electrodes=45 mm;
Process gas ($C_5F_8$/Ar/$O_2$) flow rate≈30/750/50 sccm;
RF power (60 MHz/2 MHz)≈3300 W/3800 W; and
Measurement time=120 seconds.

A second feature of the second embodiment resides in that a conductive ring member 100 is disposed around the feed rod 76 inside the feed cylinder 50. The main role of the conductive member 100 is to reduce the inductance around the feed rod 76 so as to improve the range of the variable capacitor's 78 function of adjusting the balance between outer and inner input powers, as described below.

In this plasma processing apparatus, as described above, the ratio between the input power $P_O$ into the outer upper electrode 36 and the input power $P_i$ into the inner upper electrode 38 can be arbitrarily adjusted by adjusting the capacitance $C_{78}$ of the variable capacitor 78. In general, the capacitance $C_{78}$ of the variable capacitor 78 is adjusted stepwise, using a step motor or the like. For this capacitance adjustment, it is necessary to avoid the uncontrollable resonance domain described above (in FIG. 5, 125 pF<$C_{78}$<180 pF). For this reason, the experimental test examples described above according to the first embodiment (FIGS. 6A, 6B, 7A, and 7B) mainly used a stable domain ($C_{78}$≧180 pF) on the right side of the resonance domain. However, the stable domain on the right side has a limit in increasing the ratio of the inner input power $P_i$, and also entails a large power loss. On the other hand, as shown in FIGS. 4 and 5, a domain ($C_{78}$≧125 pF) on the left side of the resonance domain has an advantage in increasing the ratio of the inner input power $P_i$, as well as a smaller power loss. However, the domain on the left side of the resonance domain becomes closer to the resonance domain, as the ratio of the inner input power $P_i$ is increased. In the case of a characteristic line with a large change rate (inclination), such as a characteristic line A shown in FIG. 11, it becomes very difficult to perform fine adjustment immediately before the resonance domain.

Figure 11:
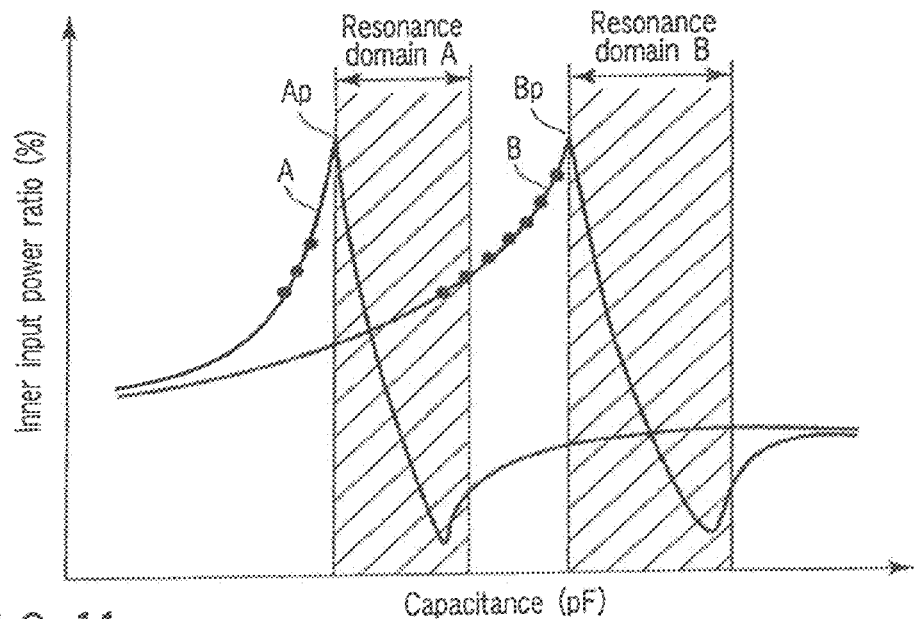
FIG. 11 is a graph showing characteristics of variable capacitance vs. inner input power according to the second embodiment.

In order to solve this problem, it is effective to modify the characteristic line of capacitance vs. inner input power ratio, as indicated with a characteristic line B shown in FIG. 11, i.e., the change rate (inclination) in the domain on the left side of the resonance domain is set smaller so as to expand the adjusting range. Then, in order to obtain a characteristic line with a gentle and broader inclination as indicated with the characteristic line B shown in FIG. 11, it is effective to reduce the inductance $L_i$ around the feed rod 76, as described below.

Figure 12:
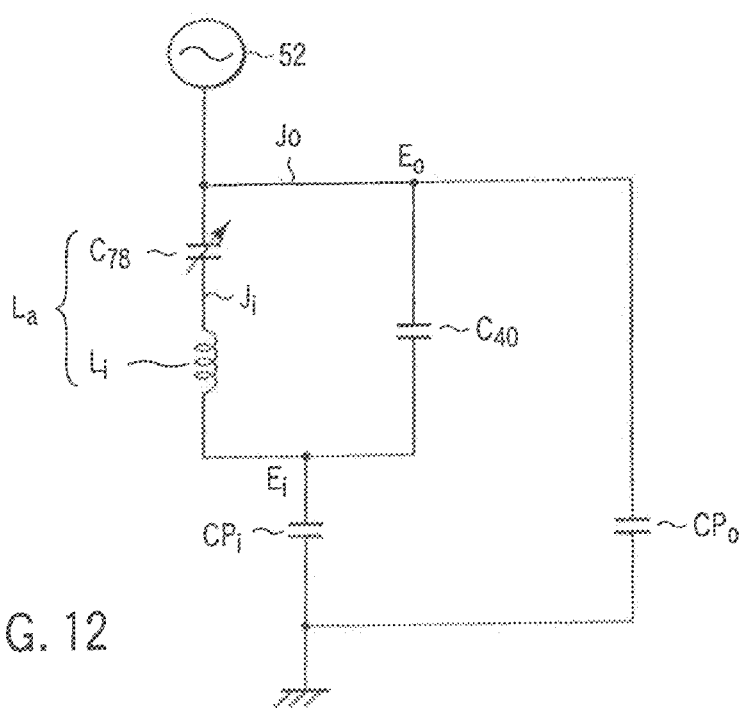
FIG. 12 is a circuit diagram showing an equivalent circuit of a plasma generation RF feed circuit according to the second embodiment.

FIG. 12 is a circuit diagram showing an equivalent circuit of a plasma generation RF feed circuit according to the second embodiment. The reactance $\omega L_i$ around the feed rod 76 always takes on an absolute value larger than the reactance $1/\omega C_{78}$ of the capacitor 78, and thus the composite reactance X of the inner waveguide $J_i$ is always inductive and can be expressed by $X=\omega L_a$. A parallel circuit formed of this apparent inductance $L_a$ and the capacitance $C_{40}$ falls in a resonance state, when the susceptance $1/\omega L_a$ of the inductance $L_a$ and the susceptance $\omega C_{40}$ of the capacitance $C_{40}$ cancel each other to be zero, i.e., when $1/\omega L_a=1/(\omega L_i-1/\omega C_{78})=\omega C_{40}$ is satisfied. In this formula, with decrease in $L_i$, the value of $C_{78}$ to establish the resonance condition described above increases, thereby approaching a characteristic line with a gentle and broader inclination immediately before the resonance domain, as indicated with the characteristic line B shown in FIG. 11. In the equivalent circuit shown in FIG. 12, the inductance $L_O$ of the outer waveguide $J_O$ is not shown, for the sake of simplicity of explanation. Even if the inductance $L_O$ is included in this equivalent circuit, the principle is the same.

Figure 13:
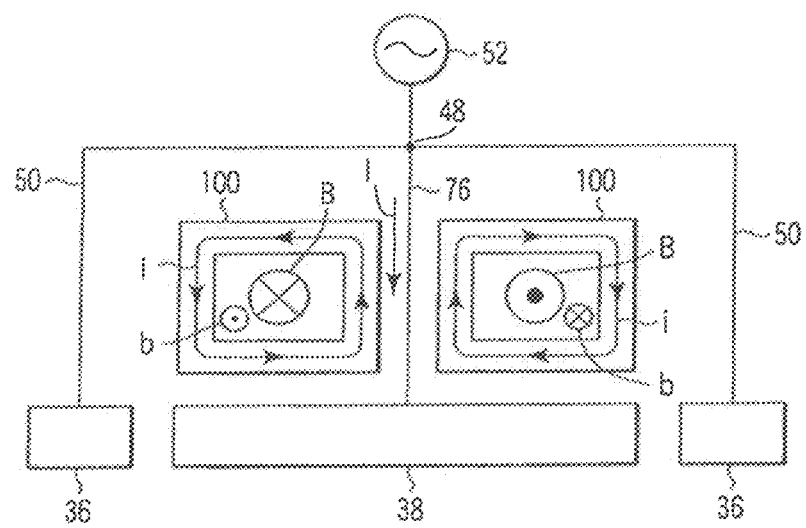
FIG. 13 is a view showing an effect of a conductive member disposed around an upper feed rod according to the second embodiment.

FIG. 13 shows an effect of the conductive member 100 according to this embodiment. When an electric current I varying with time flows through the feed rod 76, a loop magnetic flux B is generated around the feed rod 76, and an inductive electric current i interlinked with the magnetic flux B flows through the conductive member 100 due to electromagnetic induction. As a consequence, a loop magnetic flux b is generated inside and outside the conductive member 100 by the inductive electric current i, and the magnetic flux B is cancelled by that much corresponding to the magnetic flux b inside the conductive member 100. Thus, the conductive member 100 disposed around the feed rod 76 can reduce the net magnetic flux generation amount around the feed rod 76, thereby reducing the inductance $L_i$.

As regards the appearance structure of the conductive member 100, a single ring shape continuous in an annular direction is preferably used, but a plurality of conductive members disposed in an annular direction may be used instead. As regards the inner structure of the conductive member 100, a hollow ring body with a cavity shown in FIG. 13 may be used, but a solid block structure, as shown in FIG. 8, can provide a large inductance reduction effect. The volume of the conductive member 100 is preferably set larger, and is ideally or most preferably set to fill the space inside the feed cylinder 50. In practice, however, it is preferable for the conductive member 100 to occupy 1/10 to 1/3 of the space surrounded by the feed cylinder 50 and outer upper electrode 36. The conductive member 100 is made of an arbitrary conductor material, such as aluminum or a cast metal. The conductive member 100 is disposed while being electrically insulated from conductive bodies around it, such as the feed rod 76 and inner upper electrode 38.

Figure 14:
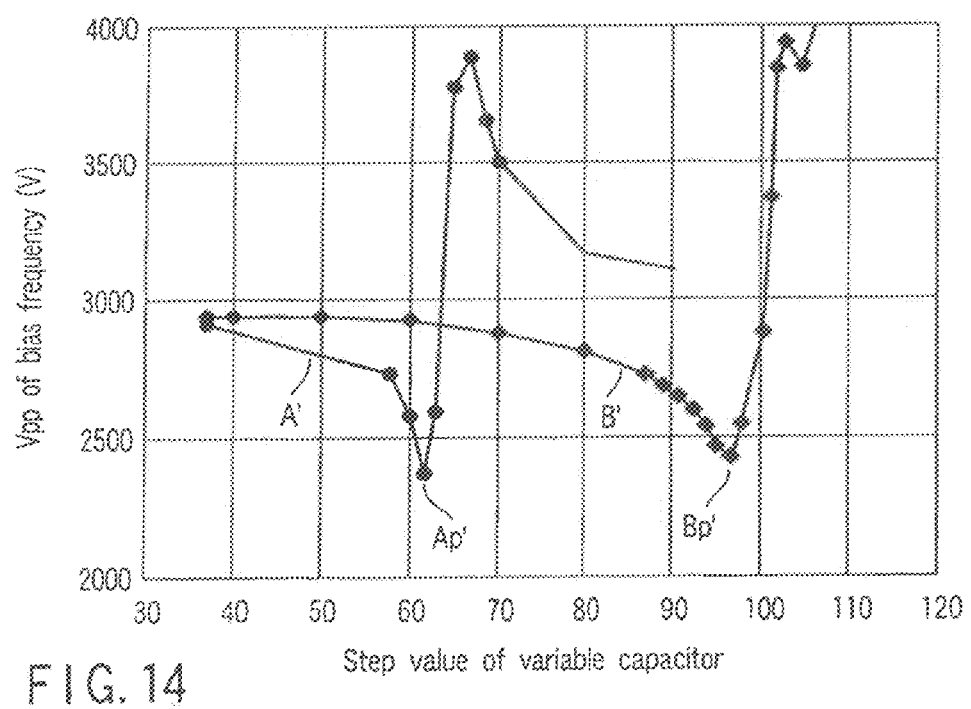
FIG. 14 is a graph showing characteristics of variable capacitance vs. bottom self-bias voltage according to the second embodiment.

FIG. 14 shows experimental data of demonstration examples, in relation to the broadening effect described above of the conductive member 100 according to this embodiment. Referring to FIG. 14, a characteristic line B' was obtained by the apparatus structure according to this embodiment, and a characteristic line A' was obtained by the apparatus structure with no conductive member 100. These characteristic lines A' and B' have upside-down shapes of the characteristic lines A and B shown in FIG. 11, respectively. Specifically, in a parallel-plate plasma apparatus of this type, as the ratio of the input power (inner input power $P_i$) into the central portion of the upper electrode 34 is increased, the plasma density becomes higher near the substrate W on the susceptor 16, and the bias frequency Vpp on the susceptor 16 (in inverse proportion to the plasma density) decreases. According to this relationship, measurement values of Vpp obtained by respective step values of the variable capacitor 78 (a control variable in proportion to the value of the capacitance $C_{78}$) were plotted to obtain the characteristic lines A' and B', which thus have upside-down shapes of the characteristic lines A and B shown in FIG. 11, respectively. According to this embodiment, thanks to the conductive member 100 disposed around the feed rod 76, when the balance between the outer and inner input powers is adjusted by the variable capacitor 78, the ratio of inner input power $P_i$ can be stably and finely controlled to a value as high as possible immediately before the resonance domain, as demonstrated by the characteristic line B' shown in FIG. 14.

Figure 15A:
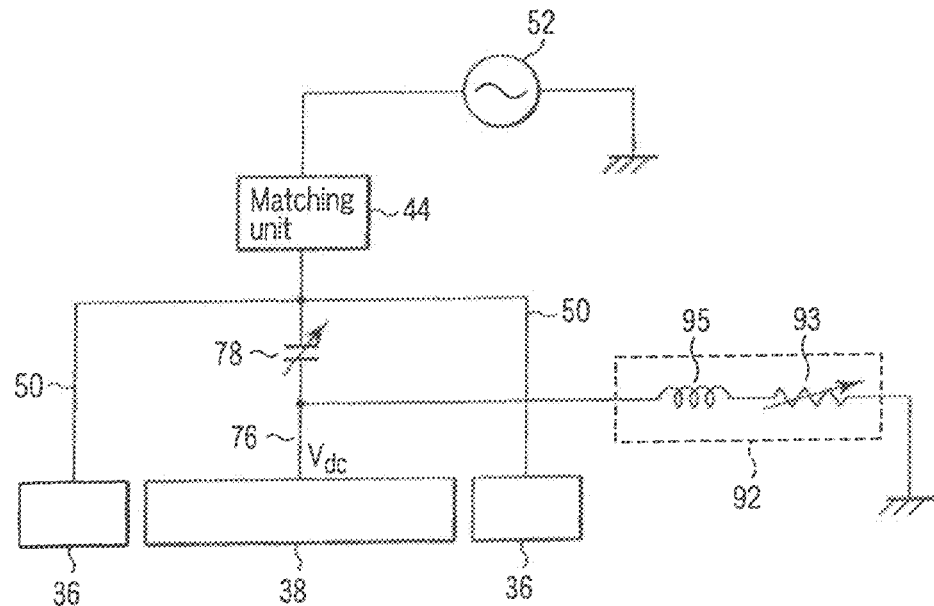
FIGS. 15A and 15B are circuit diagrams each showing the circuit structure of a low-pass filter according to the second embodiment.

A third feature of the second embodiment relates to a low-pass filter 92 connected between the inner upper electrode 38 and ground potential. As shown in FIG. 15A, the low-pass filter 92 according to this embodiment is formed of a variable resistor 93 and a coil 95 connected in series, and arranged not to allow the plasma generation RF (60 MHz) to pass through, but to allow an alternating frequency of the bias RF (2 MHz) or less and DC to pass through. According to the low-pass filter 92, the DC potential or self-bias voltage Vdc on the inner upper electrode 38 can be adjusted by adjusting the resistance value R93 of variable resistor 93.

Figure 16:
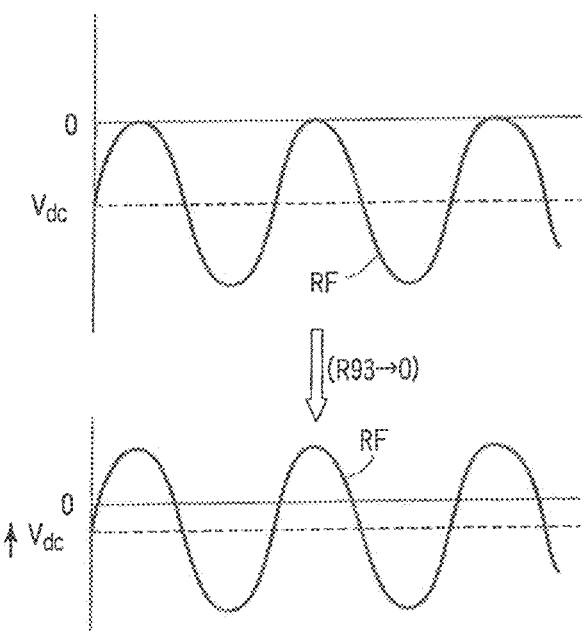
FIG. 16 is a diagram showing an effect of resistance provided in a low-pass filter according to the second embodiment.

More specifically, as shown in FIG. 16, as the resistance value R93 of the resistor 93 is set lower, the voltage drop through the resistor 93 decreases, and the negative DC potential Vdc thereby becomes higher (closer to ground potential). Conversely, as the resistance value R93 of the resistor 93 is set higher, the voltage drop through the resistor 93 increases, and the DC potential Vdc becomes lower. If the DC potential Vdc is too high (in general, it is higher than −150V), the plasma potential increases, thereby causing abnormal discharge or arcing. On the other hand, if the DC potential Vdc is too low (in general, it is lower than −450V), the inner upper electrode 38 is intensely attacked by ions, thereby hastening wear-out of the electrode.

Figure 17:
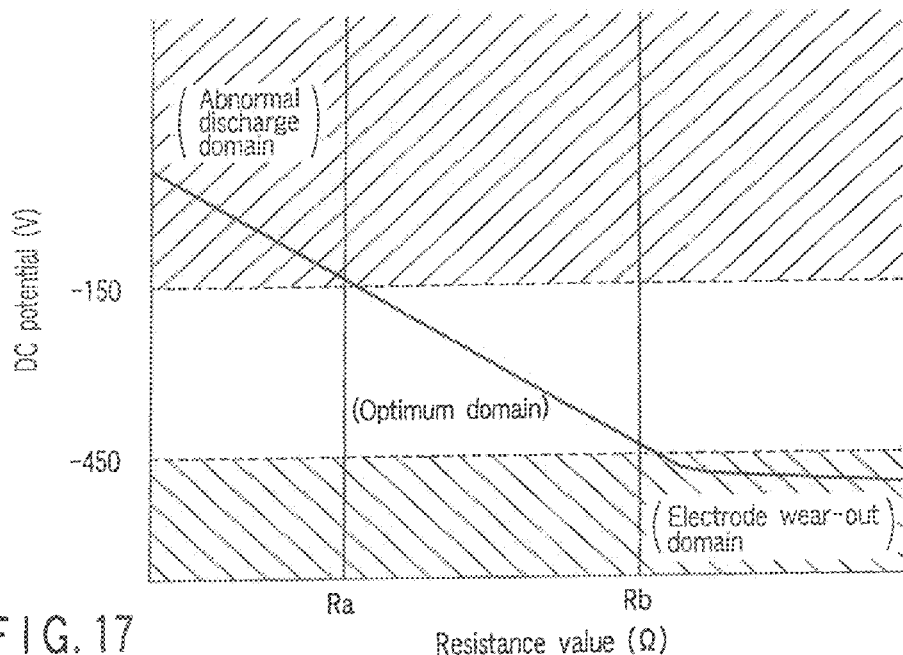
FIG. 17 is a graph showing the optimum range of resistance provided in a low-pass filter according to the second embodiment.

In another perspective, as shown in FIG. 17, the DC potential Vdc has an appropriate range (from −450V to −150V) to prevent or suppress both of abnormal discharge and electrode wear-out, and the resistance value R93 has a range (from Ra to Rb) corresponding to this appropriate range. Accordingly, the DC potential Vdc can be adjusted to be within the appropriate range described above (from −450V to −150V) by setting or adjusting the resistance value R93 of the resistor 93 to be within the range described above (from Ra to Rb). Further, depending on the value of an RF power applied to the entire upper electrode 34 (outer upper electrode 36 and inner upper electrode 38), the appropriate range (from Ra to Rb) of the resistance value R93 changes. For example, in one experiment, the lower limit resistance value Ra=about 1 MΩ was provided by an RF power of 3000 W.

Figure 15B:
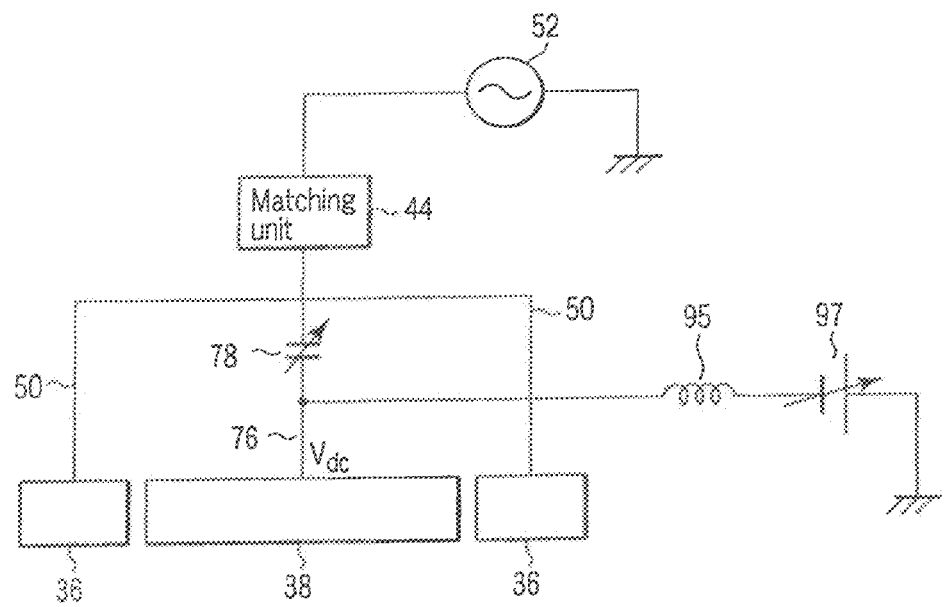

Further, as shown in FIG. 15B, the inner upper electrode 38 may be connected to ground through a variable DC power supply 97 to directly control the DC potential Vdc by the voltage of the power supply. The variable DC power supply 97 is preferably formed of a bipolar power supply.

Figure 18:
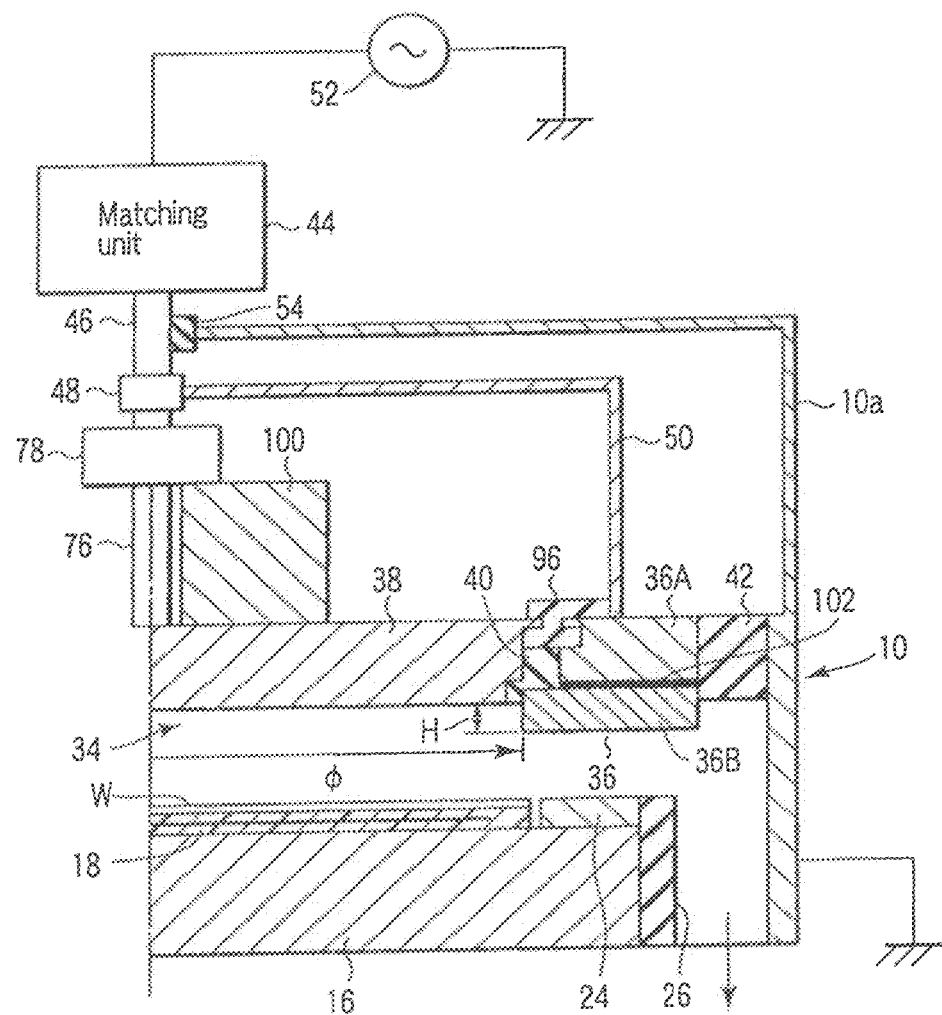
FIG. 18 is a sectional side view showing a main part of the plasma etching apparatus according to the second embodiment.
Figure 19B:
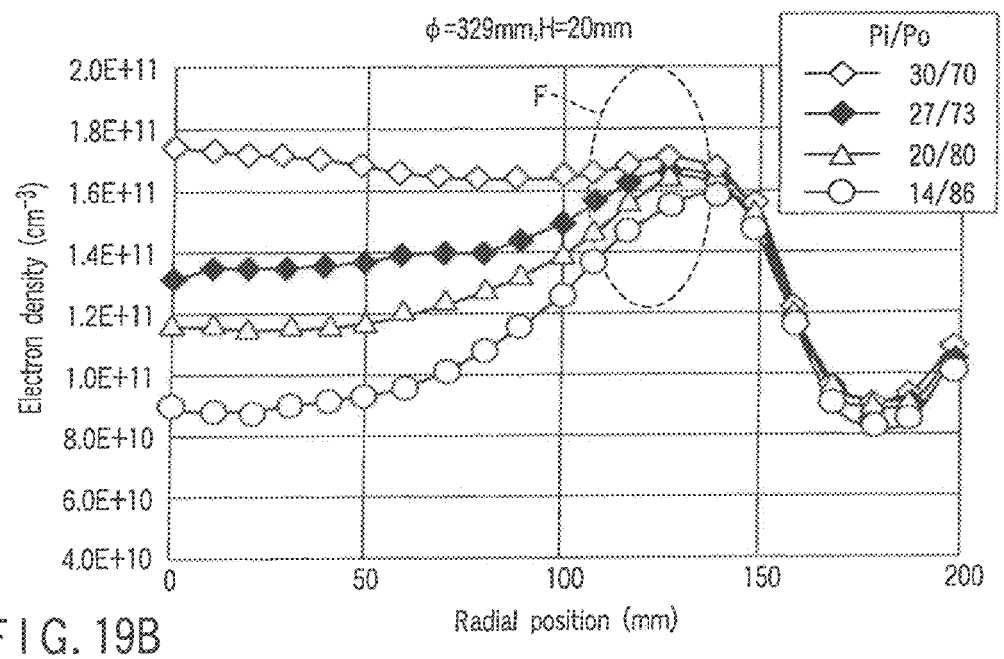
Figure 19C:
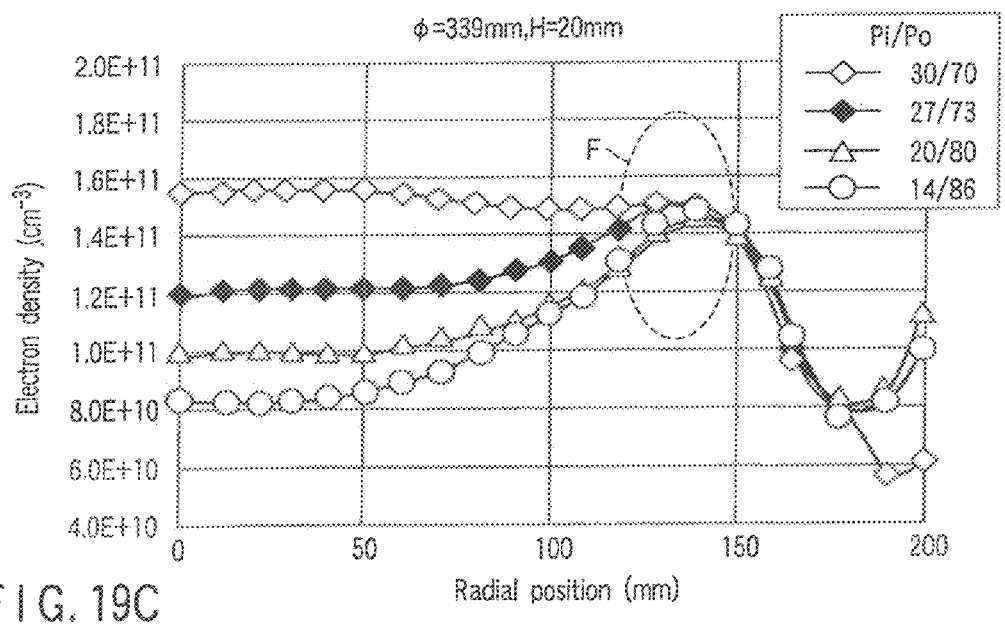
Figure 19D:
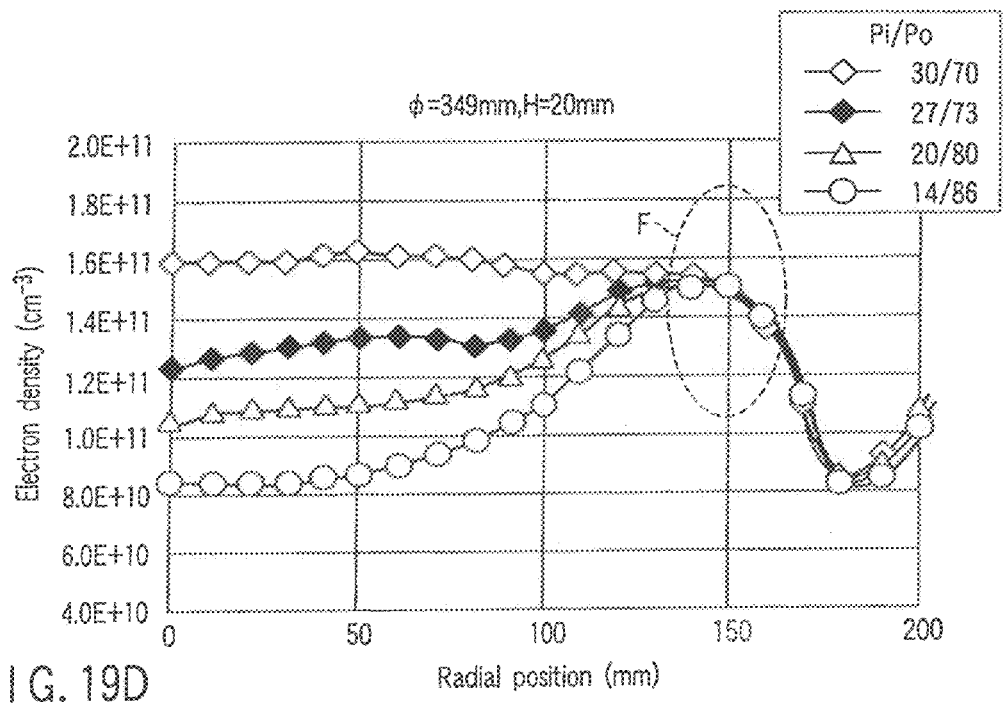
Figure 19E:
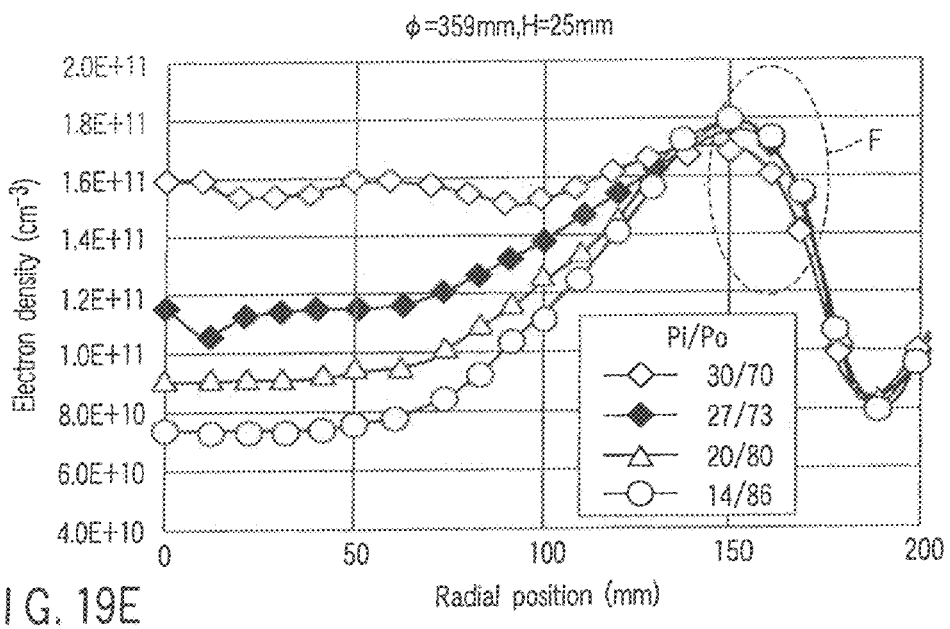

A fourth feature of the second embodiment resides in that, in the upper electrode 34, the bottom surface of the outer upper electrode 36 is protruded downward, i.e., toward the susceptor 16, more than the bottom surface of the inner upper electrode 38. FIG. 18 is a sectional side view showing a main part of the plasma etching apparatus according to the second embodiment. In this example, the outer upper electrode 36 is formed of two parts divided in the vertical direction, i.e., an upper first electrode member 36A and a lower second electrode member 36B. The main body or first electrode member 36A is made of, e.g., alumite-processed aluminum, and is connected to the feed cylinder 50. The replacement part or second electrode member 36B is made of, e.g., silicon, and is detachably fixed to and in close contact with the first electrode member 36A by bolts (not shown). The second electrode member 36B is protruded by a predetermined value H, relative to the bottom surface of the inner upper electrode 38. A member 102 for enhancing thermal conductance, such as a silicone rubber sheet, is interposed between two electrode members 36A and 36B. The contact surfaces of the two electrode members 36A and 36B may be coated with Teflon™ to reduce thermal resistance.

In the outer upper electrode 36, the protruded length H and inner diameter Φ of the protrusion part 36B can define the intensity or direction of an electric field provided from the outer upper electrode 36 or upper electrode 34 to the plasma generation space. Thus, they are important factors to thereby determine the spatial distribution characteristic of plasma density.

FIGS. 19A to 19E show examples (experimental data) concerning spatial distribution characteristics of electron density, using as parameters the protruded length H and inner diameter Φ of the protrusion part 36B. Also in this experiment, the electron density was measured at positions in the radial direction, using a plasma absorption probe (PAP). The diameter of a semiconductor wafer was set at 300 mm. As regards the main parameters Φ and H, the experimental examples shown in FIG. 19A employed Φ=329 mm and H=15 mm, the experimental examples shown in FIG. 19B employed Φ=329 mm and H=20 mm, the experimental examples shown in FIG. 19C employed Φ=339 mm and H=20 mm, the experimental examples shown in FIG. 19D employed Φ=349 mm and H=20 mm, and the experimental examples shown in FIG. 19E employed Φ=359 mm and H=25 mm. As a secondary parameter, the ratio $P_i/P_O$ (RF power ratio) between the inner input power $P_i$ and outer input power $P_O$ was set at four different values, i.e., (30/70), (27/73), (20/80), and (14/86).

In the experimental data shown in FIGS. 19A to 19E, an inflection point F at which the electron density quickly drops was moved radially outward with increase in the inner diameter Φ of the protrusion part 36B of the outer upper electrode 36, and was moved up with increase in the protruded length H of the protrusion part 36B. The ideal distribution characteristic is a characteristic in which an inflection point F is located directly above the wafer edge (a position of 150 mm), and the density is flat at a high value between the center and edge. In light of this, one characteristic (Φ=349 mm and H=20 mm) shown in FIG. 19D obtained by an RF power ratio $P_i/P_O$ of 30/70 is closest to the ideal state.

FIG. 20A shows characteristics of total uniformity $U_T$ and edge uniformity $U_E$ in the spatial distribution of electron density, using Φ and H as two-dimensional parameters. The total uniformity $U_T$ stands for planar uniformity over the entire region in the radial direction from the wafer central position ($R_0$) to the wafer edge position ($R_{150}$), as shown in FIG. 20B. The edge uniformity $U_E$ stands for planar uniformity over a region near the wafer edge, such as a region from a position of radius 130 mm ($R_{130}$) to the wafer edge position ($R_{150}$).

As understood from the characteristics shown in FIG. 20A, the protruded length H of the protrusion part 36B is remarkably influential on the total uniformity $U_T$, and also has a large effect on the edge uniformity $U_E$. On the other hand, the inner diameter Φ of the protrusion part 36B is influential on the edge uniformity $U_E$, but is scarcely influential on the total uniformity $U_T$. In total, the protruded length H of the protrusion part 36B is preferably set at 25 mm or less, and most preferably set to be near 20 mm. The inner diameter Φ of the protrusion part 36B is preferably set to be within a range of from 348 mm to 360 mm, and most preferably set to be near 349 mm. The range of from 348 mm to 360 mm means that the protrusion part 36B is disposed at a position 24 mm to 30 mm distant from the wafer edge radially outward.

It should be noted that the protrusion part 36B of the outer upper electrode 36 applies an electric field to the plasma generation space radially inward from around, thereby providing an effect of confining plasma. For this reason, the protrusion part 36B is disposed preferably or almost essentially at a position outside the wafer edge in the radial direction, in order to improve uniformity in the spatial distribution characteristic of plasma density. On the other hand, the width of the protrusion part 36B in the radial direction is not important, and thus can be arbitrarily set.

(Third Embodiment)

FIG. 21 is a sectional side view showing a main part of a plasma etching apparatus according to a third embodiment of the present invention. The parts of this apparatus can be the same as those of the second embodiment except for the featuring parts. The third embodiment has a feature in that a shield member 104 is disposed along the protrusion part 36B of the outer upper electrode 36 according to the second embodiment.

For example, the shield member 104 is formed of an aluminum plate with an alumite-processed surface, and physically and electrically coupled to the sidewall of the process container 10. The shield member 104 extends essentially in the horizontal direction from the container sidewall to the position below the protrusion part 36B of the outer upper electrode 36 to cover the bottom surfaces of the protrusion part 36B and the ring-shaped shield member 42 in a non-contacting or insulated state. The second electrode member 36B of the outer upper electrode 36 has an L-shaped cross section with a peripheral portion extending downward in the vertical direction to form a protrusion. The protruded length H and inner diameter Φ of this protrusion can be defined in accordance with the same numerical conditions as those of the second embodiment.

A function of the shield member 104 is to shield or seal RF discharge from the bottom surfaces of the protrusion part 36B of the outer upper electrode 36 and ring-shaped shield member 42, so as to suppress plasma generation directly below them. As a consequence, it is possible to primarily enhance the plasma confining effect directly above the wafer.

FIGS. 22A (with the shield member) and 22B (without the shield member) show experimental data concerning the plasma confining effect provided by the shield member 104. Where the shield member 104 was not used, as shown in FIG. 22B, the plasma electron density once dropped and then increased again to form a peak outside the wafer edge position (150 mm) in the radial direction. This was so because RF power was discharged vertically downward from the bottom surfaces of the protrusion part 36B of the outer upper electrode 36 and ring-shaped shield member 42, whereby plasma was also generated directly below them and thus electrons and ions were present there. Since a certain amount of plasma was present in a space distant from the wafer edge position radially outward, the plasma density directly above the wafer decreased by that much.

On the other hand, where the shield member 104 was used according to this embodiment, as shown in FIG. 22A, the electron density (plasma density) essentially monotonously decreased radially outward outside the wafer edge position (150 mm), while it was higher directly above the wafer as a whole. This was so because the bottom surfaces of the protrusion part 36B of the outer upper electrode 36 and ring-shaped shield member 42 did not work as an RF path any more due to the presence of the shield member 104, whereby plasma generation directly below them was remarkably reduced. The plasma confining effect or plasma diffusion-preventing effect of the shield member 104 was enhanced, with increase in the RF power of the RF power supply 52.

Further, as a secondary effect, where plasma generation is remarkably reduced by the shield member 104 outside the wafer edge position, as described above, etching species, such as radicals and ions, are reduced. As a consequence, it is possible to effectively prevent undesirable polymer films from being deposited on portions inside the container (particularly near the shield member 104).

For example, conventionally, where a Low-k film (an inter-level insulating film with a low dielectric constant) is etched, a plasma etching is performed, and then ashing (resist removal) is performed using $O_2$ gas within the same chamber. At this time, reactive species (such as CF and F), which have been deposited as polymers inside the container during the previous plasma etching, are activated by active oxygen atoms in plasma, and cause damage to the Low-k film (Low-k damages), such that they etch the via-holes of the film into a bowing shape or invade the film and change its k value. According to this embodiment, however, the shield member 104 can effectively prevent undesirable deposition of reactive species during plasma etching, thereby solving problems concerning Low-k damages described above. The shield member 104 may be made of an arbitrary conductor or semiconductor (such as, silicon), or a combination of different materials.

FIG. 21 also shows an arrangement of cooling medium passages 106 and 108 formed in the upper electrode 34 (36 and 38). A cooling medium set at an adjusted temperature is circulated within each of the cooling medium passages 106 and 108 from a chiller unit (not shown) through lines 110 and 112. Specifically, the cooling medium passages 106 are formed in the first electrode member 36A of the outer upper electrode 36. Since the second electrode member 36B is coupled with the first electrode member 36A through a coating or sheet 102 for enhancing thermal conductance, it can also be effectively cooled by the cooling mechanism.

The electrodes are supplied with a cooling medium even when the RF power supplies 52 and 90 are in the OFF-state. Conventionally, the plasma processing apparatus of this type employs an insulative cooling medium, such as Galden™. In this case, when the cooling medium flows through a cooling medium passage, it generates an electrostatic charge by friction, by which the electrode enters an abnormally high voltage state. If an operator's hand touches the electrode in this state during a maintenance operation or the like in which the RF power supplies are in the OFF-state, the operator may get an electric shock. However, the plasma processing apparatus according to this embodiment allows electrostatic charge generated in the inner upper electrode 38 to be released to ground through the resistor 93 of the low-pass filter 92 (see FIG. 8), whereby an operator is prevented from getting an electric shock.

(Fourth Embodiment)

Figure 23:
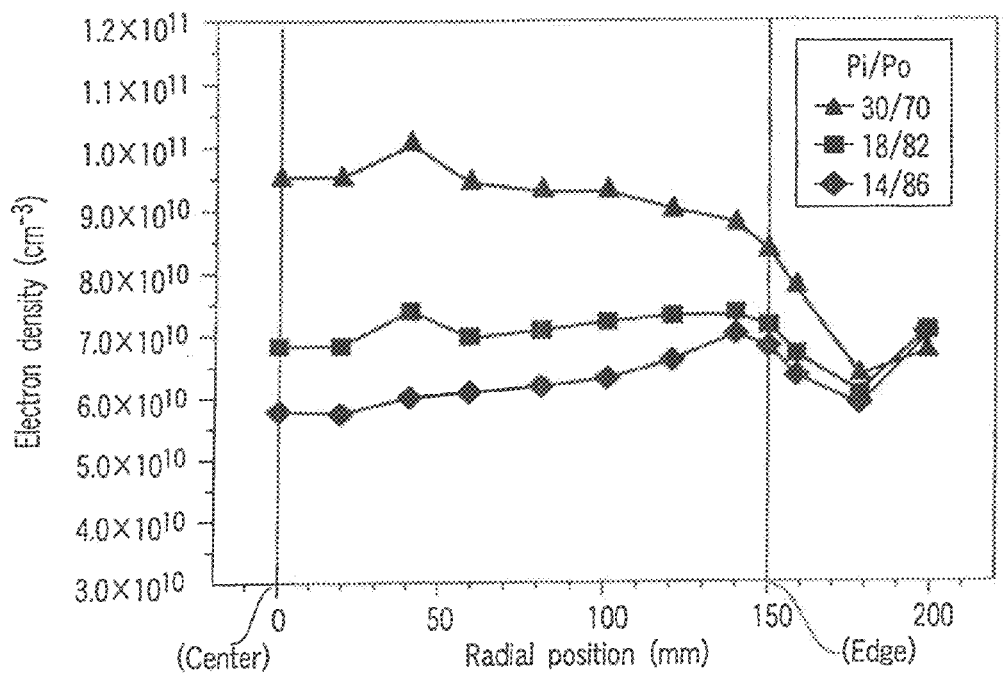
FIG. 23 is a graph showing spatial distribution characteristics of electron density, using inner/outer input power ratio as a parameter, according to a fourth embodiment of the present invention.
Figure 24:
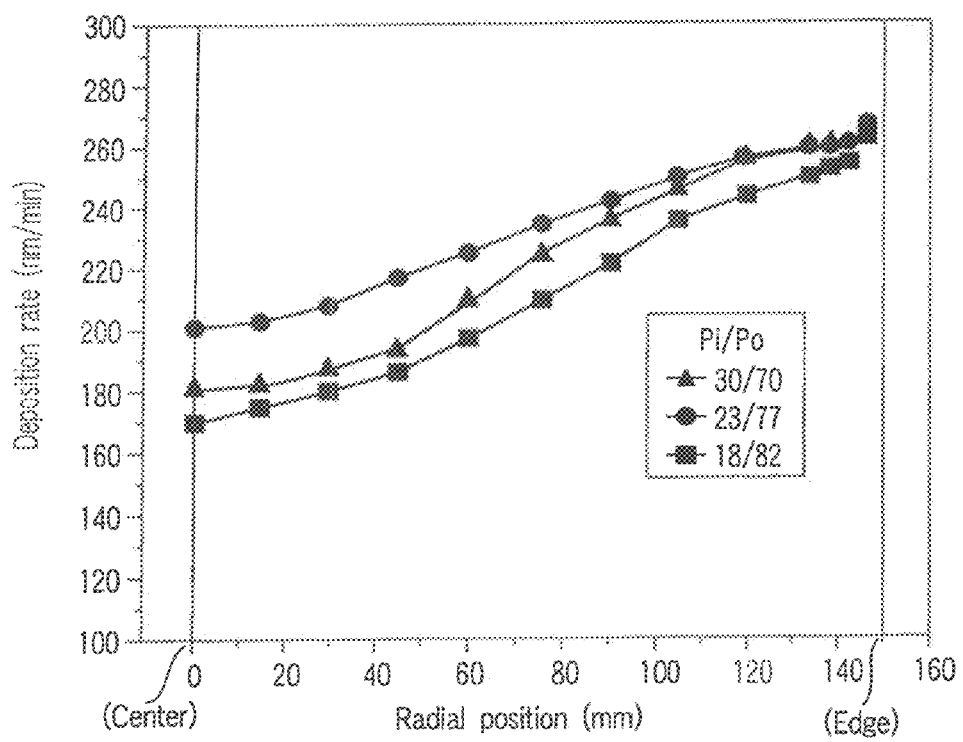
FIG. 24 is a graph showing spatial distribution characteristics of polymer film deposition rate, using inner/outer input power ratio as a parameter, according to the fourth embodiment.
Figure 25:
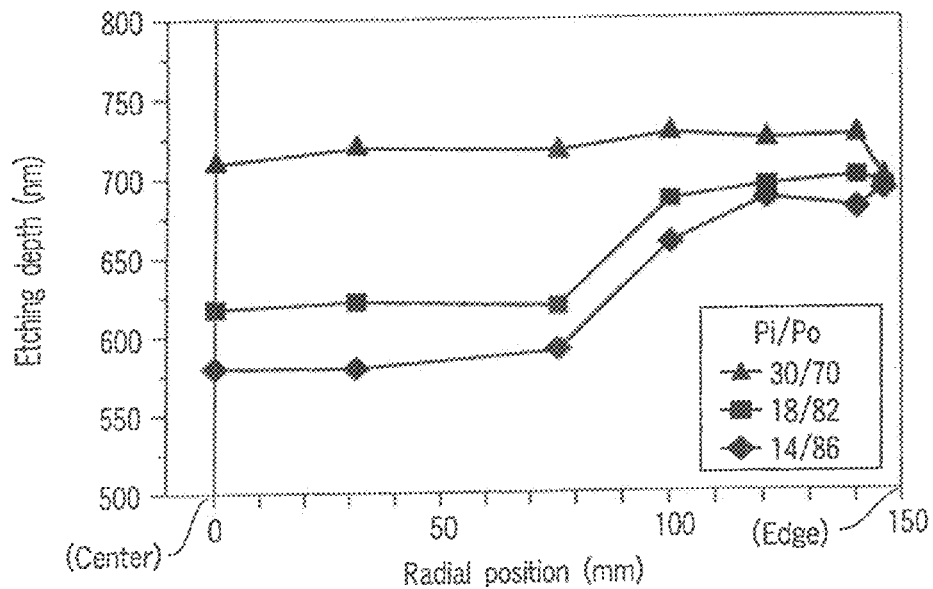
FIG. 25 is a graph showing spatial distribution characteristics of etching depth, using inner/outer input power ratio as a parameter, according to the fourth embodiment.

Using the plasma etching apparatus according to the third embodiment (FIGS. 8 and 21), an experiment was conducted of etching a silicon oxide film ($SiO_2$) to form a hole having a diameter (Φ) of 0.22 μm. In this experiment, etching characteristics (particularly etching rate) were examined, using as a parameter the RF power input ratio ($P_i/P_o$) between the outer upper electrode 36 and inner upper electrode 38. Other etching conditions are shown below. FIGS. 23 to 25 show experimental result data.

Wafer diameter=300 mm;
Pressure inside the chamber=20 mTorr;
Temperature (upper electrode/chamber sidewall/lower electrode)=20/60/60° C.;
Heat transmission gas (He gas) supply pressure (central portion/edge portion)=20/35 Torr;
Distance between the upper and lower electrodes=45 mm;
Protruded length (H) of the outer upper electrode=15 mm;

Process gas ($C_5F_8/CH_2F_2/N_2/Ar/O_2$)≈10/20/110/560/10 sccm;
RF power (60 MHz/2 MHz)≈2300 W/3500 W; and
Etching time=120 seconds.

As shown in FIG. 23, as the ratio of the inner input power $P_i$ increased, i.e., 14%, 18%, and 30%, the electron density or plasma density became higher in proportion to the $P_i$ ratio near the wafer central portion, while it did not change near wafer edge portion. Accordingly, where the RF power input ratio ($P_i/P_0$) is adjusted on the basis of this, the spatial distribution characteristic of plasma density can be controlled in the radial direction.

FIG. 24 shows the measurement result of deposition rate of a polymer film, formed from reaction products and reactive species, at respective positions in the radial direction, wherein the deposition rate is in proportion to radical density. This experiment was conducted to see the effect of change in the RF power input ratio ($P_i/P_0$) on the radical density. A bare silicon wafer was used as a sample substrate on which the polymer film was deposited. As indicated by the experimental data shown in FIG. 24, change in the RF power input ratio ($P_i/P_0$) only had a very small influence on the polymer film deposition rate i.e., the spatial distribution characteristic of radical density.

FIG. 25 shows etching depth measured at respective positions of the wafer in the radial direction, obtained by the $SiO_2$ etching described above. As shown in FIG. 25, as the ratio of the inner input power $P_i$ increased, i.e., 14%, 18%, and 30%, the etching depth became larger in proportion to the $P_i$ ratio near the wafer central portion, while it did not differ so much near wafer edge portion. This was similar to that of the electron density (FIG. 24).

As described above, judging from the experimental data shown in FIGS. 23 to 25, the following matters have been confirmed. Specifically, by adjusting the RF power input ratio ($P_i/P_0$) between the outer upper electrode 36 and inner upper electrode 38, the spatial distribution characteristic of plasma density in the radial direction can be controlled without substantially affecting the spatial distribution characteristic of radical density, i.e., independently of the control over the spatial distribution of radical density. Accordingly, the uniformity of etching depth i.e., etching rate, can be improved by adjusting the RF power input ratio ($P_i/P_0$). It should be noted that, if the plasma etching apparatus according to the first or second embodiment (FIGS. 1, 8, and 18) is used, the same experimental result as described above is obtained.

(Fifth Embodiment)

Using the plasma etching apparatus according to the third embodiment (FIGS. 8 and 21), a simulation was conducted of etching a silicon oxide film ($SiO_2$) with a CF family process gas. In this experiment, the distributions of radicals or reaction products were examined, using as a parameter the ratio (FC/FE) between the flow rate FC of a process gas delivered from the central showerhead (62 and 56a) and the flow rate FE of the process gas delivered from the peripheral showerhead (64 and 56a). In this simulation, it was assumed that neither reaction nor absorption of reaction products or reactive species was caused on the wafer surface, but the following reaction was simply caused on the blanket $SiO_2$ film.

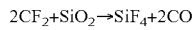

Other principal etching conditions are shown below. FIGS. 26 to 30 show simulation result concerning radicals and reaction products. FIG. 31 shows the type and generation rate (denoted by a percentage value in brackets) of radicals generated by gradual dissociation from molecules of the main etching gas ($C_4F_8$).

Wafer diameter=200 mm;
Pressure inside the chamber=50 mTorr;
Temperature (upper electrode/chamber sidewall/lower electrode)=20/60/60° C.;
Heat transmission gas (He gas) supply pressure (central portion/edge portion)=10/35 Torr;
Distance between the upper and lower electrodes=30 mm;
Protruded length (H) of the outer upper electrode=15 mm;
Process gas ($C_4F_8/N_2/Ar$)≈5/120/1000 sccm; and
RF power (60 MHz/2 MHz)≈1200 W/1700 W.

Figure 26:
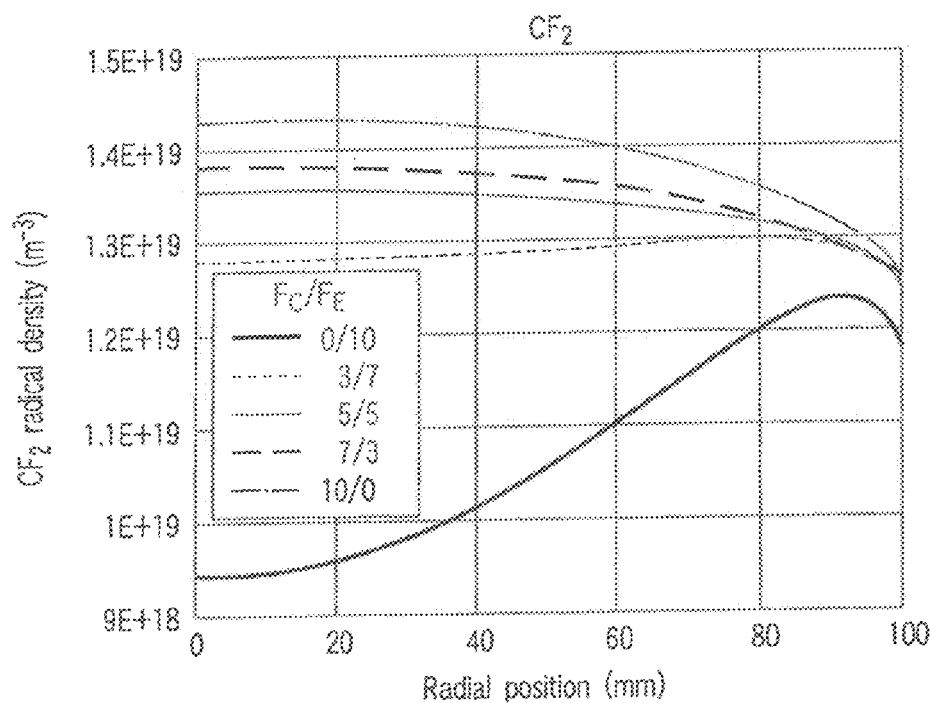
FIG. 26 is a graph showing spatial distribution characteristics of $CF_2$ radical density, using center/periphery gas flow-rate ratio as a parameter, according to a fifth embodiment of the present invention.

As shown in FIG. 26, the distribution characteristic of $CF_2$ density, which is the main reactive species, was remarkably influenced by the gas flow-rate ratio (FC/FE) between the center and periphery. Specifically, as the ratio of the central gas flow rate FC was increased, the $CF_2$ density became higher near the wafer central portion while it did not change so much near the wafer edge portion. As shown in FIG. 28, the distribution characteristic of CO radical density also showed a similar change with change in the gas flow-rate ratio (FC/FE) between the center and periphery. By contrast, as shown in FIG. 27, the distribution characteristic of Ar radical density scarcely changed with change in the gas flow-rate ratio (FC/FE) between the center and periphery.

Figure 29:
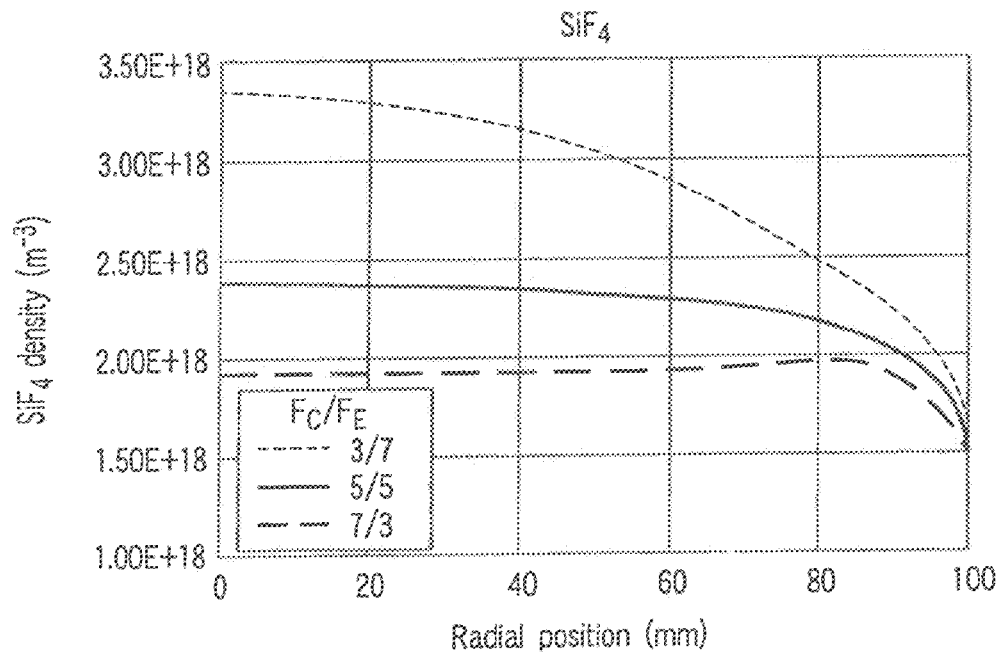
FIG. 29 is a graph showing spatial distribution characteristics of $SiF_4$ reaction products, using center/periphery gas flow-rate ratio as a parameter, according to the fifth embodiment.
Figure 30:
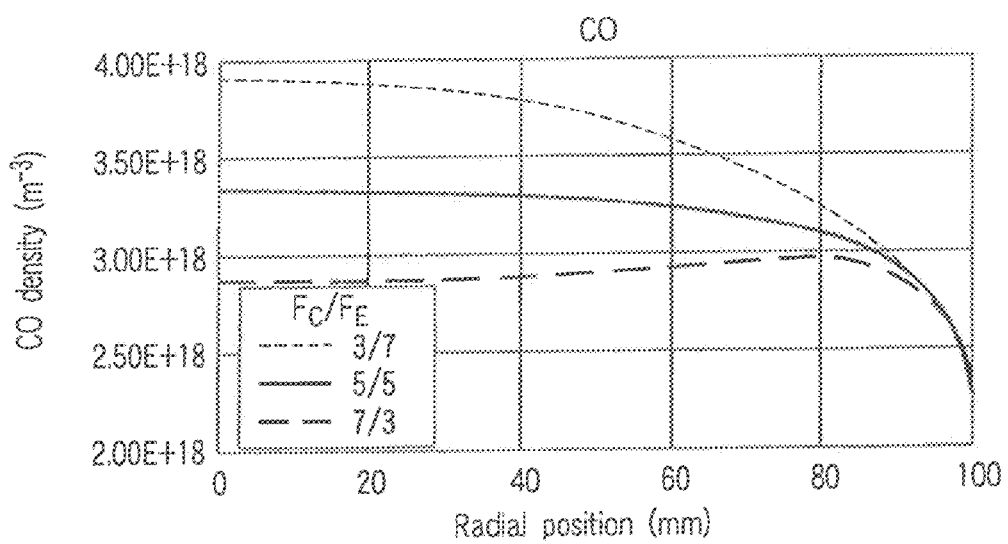
FIG. 30 is a graph showing spatial distribution characteristics of CO reaction products, using center/periphery gas flow-rate ratio as a parameter, according to the fifth embodiment.

As regards reaction products, as shown in FIGS. 29 and 30, either of $SiF_4$ density and CO density was remarkably influenced by the gas flow-rate ratio (FC/FE) between the center and periphery. More specifically, as the ratio of the central gas flow rate FC was reduced, each of the $SiF_4$ density and CO density became higher near the wafer central portion while it did not change so much near the wafer edge portion. Where the central gas flow rate FC was equal to the peripheral gas flow rate FE (FC/FE=50/50), the density became higher near the wafer central portion than near the wafer edge portion. As described above, reaction products tended to gather to the central side, because reaction products were less moved laterally by a fresh gas flow at the central portion, as compared with the peripheral portion.

If reaction products have a non-uniform distribution on a wafer, they not only affect the uniformity of process gas supply rate or chemical reaction among respective positions, but also may directly affect the etching shape or selectivity. According to this embodiment, as shown in FIGS. 29 and 30, where the central gas flow rate FC is set to be higher than the peripheral gas flow rate FE (FC/FE≈70/30 in this shown example), the space density distribution of reaction products can become uniform. It should be noted that, if the plasma etching apparatus according to the first or second embodiment (FIGS. 1, 8, and 18) is used, the same simulation result as described above is obtained.

(Sixth Embodiment)

Using the plasma etching apparatus according to the third embodiment (FIGS. 8 and 21), an experiment was conducted of etching a BARC (antireflective film). In this experiment, the etching shape and selectivity were examined, using the gas flow-rate ratio (FC/FE) between the center and periphery as a parameter. A test sample shown in FIG. 32A was used. A mask having an opening diameter (Φ) of 0.12 μm, a photoresist film having a thickness of 350 nm, a BARC film having a thickness of 80 nm, and an $SiO_2$ film having a thickness of 700 nm were used. "Oxide loss" and "resist remaining amount" were measured as examination items for the selectivity, and "bottom CD" was measured as an examination item for the etching shape or dimensional accuracy. FIG. 32B shows measurement values of the respective examination items at FC/FE=50/50. FIG. 32C shows measurement values of the respective examination items at FC/FE=70/30. As regards the measurement point, "center" denotes a position at the wafer center, and "edge" denotes a position 5 mm distant from the wafer notch end toward the center. Principal etching conditions were as follows:

Wafer diameter=300 mm;
Pressure inside the chamber=150 mTorr;
Heat transmission gas (He gas) supply pressure (central portion/edge portion)=10/25 Torr;
Distance between the upper and lower electrodes=30 mm;
Protruded length (H) of the outer upper electrode=15 mm;
Process gas (CF4)≈200 sccm;
RF power (60 MHz/2 MHz)≈500 W/600 W; and
Etching time=30 seconds.

As regards the examination items for the BARC etching, the "oxide loss" is the etched depth of the underlying $SiO_2$ film provided by over etching of the BARC etching. For this value, a smaller value is better, but a priority resides in that a smaller difference in this value over the wafer (particularly the difference between the center and edge) is better. The "resist remaining amount" is the thickness of the photo-resist remaining after the etching. For this value, a larger value is better, and a smaller difference in this value is also better. The "bottom CD" is the bottom diameter of a hole formed in the BARC. For this value, a value closer to the mask opening diameter Φ is better, and a smaller difference in this value is also better.

As shown in FIG. 32B, where the central gas flow rate FC was equal to the peripheral gas flow rate FE (5:5), the differences between the center and edge were large in all the examination items, and particularly the difference was large in the "resist remaining amount". By contrast, as shown in FIG. 32B, where the central gas flow rate FC was larger than the peripheral gas flow rate FE (7:3), all the examination items stably took on better values and became uniform between the center and edge, i.e., the selectivity and etching shape were remarkably improved.

As described above, according to this embodiment, within the process container 10, particularly within the plasma generation space defined between the upper electrode 34 and lower electrode 16, the inner upper electrode 38 of the upper electrode 34 is used while the ratio (FC/FE) between the process gas flow rate FC delivered from the central showerhead (62 and 56a) and the process gas flow rate FE (64 and 56a) delivered from the peripheral showerhead is adjusted. As a consequence, the spatial distribution of radical density can be controlled to uniformize etching characteristics (such as the selectivity and etching shape) on the basis of radicals. It should be noted that, if the plasma etching apparatus according to the first or second embodiment (FIGS. 1, 8, and 18) is used, the same measurement result as described above is obtained.

(Seventh Embodiment)

Figures 33C, 34:
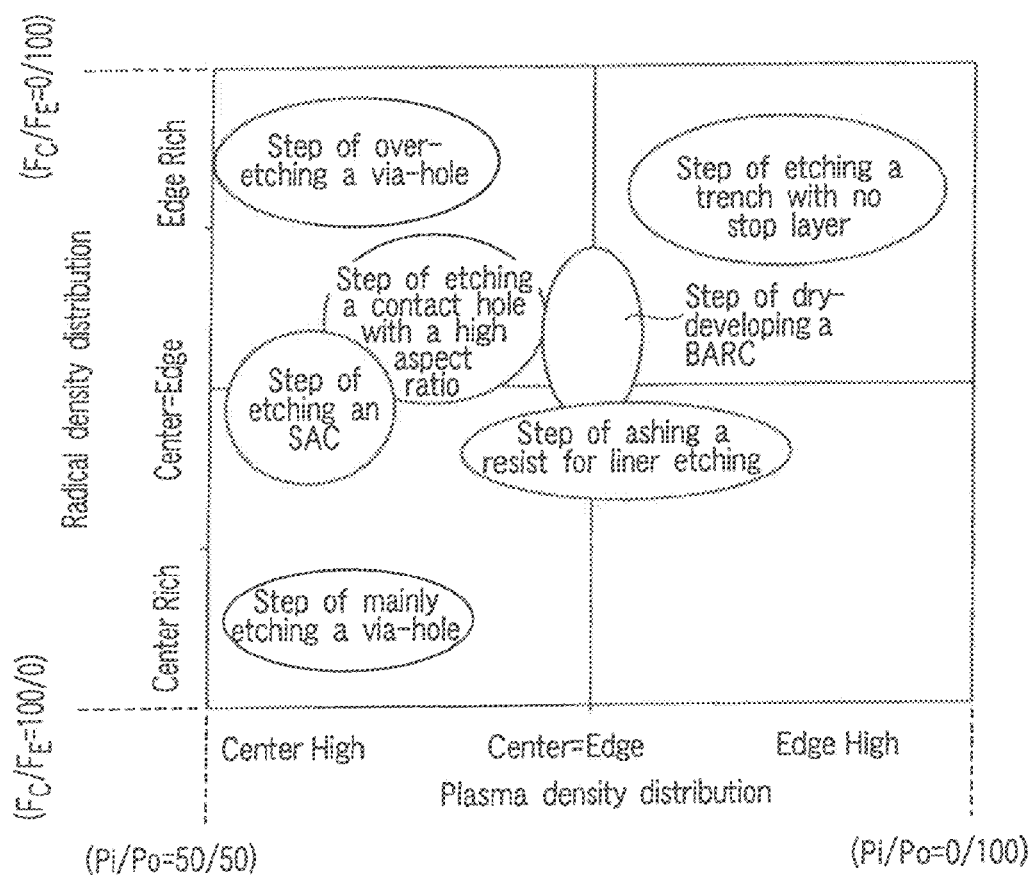

Using the plasma etching apparatus according to the third embodiment (FIGS. 8 and 21), an experiment was conducted of etching an $SiO_2$ film. In this experiment, the etching shape was examined, using the gas flow-rate ratio (FC/FE) between the center and periphery as a parameter. A test sample shown in FIG. 33A was used. A mask having an opening diameter (Φ) of 0.22 μm, a photo-resist film having a thickness of 500 nm, a BARC film having a thickness of 100 nm, and an $SiO_2$ film having a thickness of 1 μm were used. "Etching depth", "top CD", and "bottom CD" were measured as examination items for the etching shape. FIG. 33B shows measurement values of the respective examination items at FC/FE=50/50. FIG. 33C shows measurement values of the respective examination items at FC/FE=10/90. Principal etching conditions were as follows:

Wafer diameter=300 mm;
Pressure inside the chamber=20 mTorr;
Temperature (upper electrode/chamber sidewall/lower electrode)=20/60/60° C.
Heat transmission gas (He gas) supply pressure (central portion/edge portion)=20/35 Torr;
Distance between the upper and lower electrodes=45 mm;
Protruded length (H) of the outer upper electrode=15 mm;
Process gas $(C_5F_8/CH_2F_2/N_2/Ar/O_2)$≈10/20/110/560/10 sccm;
RF power (60 MHz/2 MHz)≈2300 W/3500 W;
RF power ratio (inner input power $P_I$/outer input power $P_O$)=30:70; and
Etching time=120 seconds.

As regards the examination items for the $SiO_2$ etching, the "etching depth" is the depth of a hole formed in the $SiO_2$ film by the etching time (120 seconds), i.e., it corresponds to the etching rate. The "top CD" and "bottom CD" are the top and bottom diameters of the hole formed in the $SiO_2$ film, and, as these values are closer to each other, the vertical shape characteristic of the hole (anisotropy) is better. As a matter of course, for each of the examination items, it is more preferable that the difference between the center and edge is smaller.

As shown in FIG. 33B, where the central gas flow rate FC was equal to the peripheral gas flow rate FE (5:5), the difference was large in the "etching depth", and values of the ratio of bottom CD/top CD at respective positions were small, i.e., the holes were more tapered. By contrast, as shown in FIG. 33B, where the central gas flow rate FC was smaller than the peripheral gas flow rate FE (1:9), the "etching depth" i.e., etching rate became more uniform, and the vertical shape characteristic was improved and more uniform.

As described above, also in this embodiment, by adjusting the ratio (FC/FE) between the inner gas flow rate FC and the outer gas flow rate FE, the spatial distribution of radical density can be controlled to uniformize etching characteristics (particularly the etching shape) on the basis of radicals. It should be noted that, if the plasma etching apparatus according to the first or second embodiment (FIGS. 1, 8, and 18) is used, the same measurement result as described above is obtained.

According to the embodiments described above, the plasma density distribution and the radical density distribution can be controlled independently of each other within the plasma generation space defined in the process container 10. This independent control over two systems can be used to preferably deal with various plasma process applications, such as those shown in the map of FIG. 34.

The embodiments described above may be modified in various manners, in accordance with the technical ideas of the present invention. For example, only the outer upper electrode 36 may be supplied with an RF from the first RF power supply 52 through the matching unit 44 and feed cylinder 50, while the inner upper electrode 38 being supplied with no RF. Also in this case, the inner upper electrode 38 can function as a showerhead or function as an electrode for an RF output from the second RF power supply 90 to flow to ground. Alternatively, the inner upper electrode 38 may be replaced with a single-purpose showerhead with no electrode function. In the embodiments described above, the outer upper electrode 36 is formed of one or single ring electrode, but it may be formed of a plurality of electrodes combined to form a ring as a whole. Further, the inner diameter of the outer upper electrode 36 may be set very small, or the outer upper electrode 36 may be formed of a circular plate. Depending on the application, the second RF power supply 90 may be omitted.

The present invention can be applied not only to plasma etching, but also to various plasma processes, such as plasma CVD, plasma oxidation, plasma nitridation, and sputtering. As regards a target substrate, the present invention can be applied not only to a semiconductor wafer, but also to various substrates for a flat panel display, photo mask, CD substrate, and print substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A capacitive coupling parallel-plate plasma etching apparatus for subjecting a target substrate to a plasma etching process, the apparatus comprising:
a process container configured to have a vacuum atmosphere therein;
an upper electrode and a lower electrode disposed inside the process container to face each other such that the lower electrode is configured to support the target substrate and a plasma generation space is present between the upper electrode and the lower electrode;
an RF (radio frequency) power supply mechanism configured to apply an RF power to the upper electrode;
a gas distribution cell disposed inside the upper electrode and configured to distribute a process gas to be supplied into the process container; and
a process gas supply mechanism configured to supply the process gas into the gas distribution cell, wherein
the upper electrode includes outer and inner upper electrodes electrically insulated from each other and disposed on a peripheral side and a central side, respectively, in a radial direction relative to a center through which a vertical line extending from a center of the target substrate passes, such that the inner upper electrode faces the plasma generation space essentially all over the target substrate, the outer upper electrode surrounds the inner upper electrode and is positioned radially outside an outer peripheral edge of the target substrate, and outer and inner RF discharge regions are defined by the outer and inner upper electrodes, respectively,
the inner upper electrode includes a single electrode plate facing the plasma generation space essentially all over the target substrate and a single conductive electrode support disposed above the electrode plate and detachably supporting the electrode plate such that an electrode plate and the electrode support define a horizontal outer contour of the inner upper electrode, and the gas distribution cell is a bore formed inside the electrode support above and over the lower electrode,
the RF power supply mechanism includes a common RF power supply connected to the outer and inner upper electrodes and configured to output the RF power, and an electricity feeding structure configured to supply the RF power from the common RF power supply to the outer and inner upper electrodes, the electricity feeding structure including a variable capacitor disposed between the RF power supply and at least one of the outer and inner upper electrodes to cause the RF power to be discharged toward the plasma generation space from the outer and inner RF discharge regions at a power ratio therebetween set by the variable capacitor, the power ratio being adjustable by the variable capacitor to control spatial distribution of density of the plasma relative to the target substrate,
the electricity feeding structure includes: a central conductive member connected to a central portion of the inner upper electrode; a first cylindrical conductive member surrounding the central conductive member and substantially continuously connected to the outer upper electrode in an annular direction; a conductive connector connecting the first cylindrical conductive member to the central conductive member; and a second cylindrical conductive member surrounding the first cylindrical conductive member and connected to ground potential, such that the RF power is divided by the conductive connector and transmitted to the central conductive member and the first cylindrical conductive member, and such that an outer coaxial path is formed as a waveguide between the second cylindrical conductive member and the first cylindrical conductive member, and an inner coaxial path is formed as a waveguide between the second cylindrical conductive member and the central conductive member,
the gas distribution cell is internally divided by an annular partition member disposed therein into outer and inner gas supply cells on a peripheral side and a central side, respectively, in the radial direction,
the inner upper electrode includes a plurality of gas delivery holes formed therein and communicating with the outer and inner gas supply cells, such that an outer gas delivery region is defined by a first portion of the plurality of gas delivery holes communicating with the outer gas supply cell and an inner gas delivery region is defined by a second portion of the plurality of gas delivery holes communicating with the inner gas supply cell, and thus the outer and inner process gas delivery regions are present on a peripheral side and a central side, respectively, in the radial direction on the inner RF discharge region,
the outer upper electrode has no gas delivery holes formed therein, and thus the outer RF discharge region includes no process gas delivery region,
the process gas supply mechanism includes a common process gas supply source connected to the outer and inner gas supply cells and a flow rate control valve disposed between the process gas supply source and at least one of the outer and inner gas supply cells to cause the process gas to be delivered toward the plasma space from the outer and inner process gas delivery regions at a flow rate ratio therebetween set by the flow rate control valve, the flow rate ratio being adjustable by the flow rate control valve to control spatial distribution of density of radicals in the plasma relative to the target substrate independently of the spatial distribution of density of the plasma, and
the outer upper electrode includes a support electrode member disposed on an upper side and a replacement electrode member disposed on a lower side and detachably attached to the support electrode member, such that the support electrode member has a bottom surface above a bottom surface of the inner upper electrode, and the replacement electrode member has a bottom surface below the bottom surface of the inner upper electrode and an inner side surface facing the plasma generation space.

2. The apparatus according to claim 1, wherein the variable capacitor is disposed on the central conductive member.

3. The apparatus according to claim 1, wherein the flow rate control valve includes two flow rate control valves respectively disposed between the process gas supply source and the outer and inner gas supply cells.

4. The apparatus according to claim 1, wherein the process container includes a container sidewall made of a conductive material and connected to ground potential, and the second cylindrical conductive member extends upward continuously from the container sidewall and electrically connected to the container sidewall.

5. The apparatus according to claim 1, wherein the first cylindrical conductive member includes a first upper portion extending radially outward from the conductive connector above the central conductive member and a first side portion extending downward from an end of the first upper portion to the outer upper electrode, and the second cylindrical conductive member includes a second upper portion extending radially outward along and above the first upper portion and a second side portion extending downward from an end of the second upper portion along and outside the first side portion.

6. The apparatus according to claim 1, wherein a radius ratio of a radius of the second cylindrical conductive member relative to a radius of the first cylindrical conductive member is set to be within a range of from 1.5 to 1.7.

7. The apparatus according to claim 1, wherein the electricity feeding structure has an outer impedance from the common RF power supply to the outer upper electrode and an inner impedance from the common RF power supply to the inner upper electrode larger than outer impedance.

8. The apparatus according to claim 1, wherein the apparatus further comprises a focus ring disposed to surround the target substrate to improve uniformity of the plasma etching process on the target substrate and to be opposite to the outer upper electrode.

9. The apparatus according to claim 1, wherein the outer upper electrode has a planar area set to be ¼ of 1 times a planar area of the inner upper electrode.

10. The apparatus according to claim 1, wherein the outer upper electrode is separated from the inner upper electrode by an annular gap of 0.25 to 2.0 mm, in which a dielectric body is disposed to electrically insulate the outer upper electrode from the inner upper electrode.

11. The apparatus according to claim 1, wherein the apparatus further comprises an additional RF power supply mechanism connected to the lower electrode and configured to supply the lower electrode with an RF power having a frequency lower than that of the RF power supplied to the upper electrode.

12. The apparatus according to claim 11, wherein a low-pass filter is connected to the inner upper electrode and is not connected to the outer upper electrode, the low-pass filter being configured to prevent the RF power supplied from the common RF power supply from passing through and allow the RF power supplied from the additional RF power supply mechanism to pass through to ground.

13. The apparatus according the claim 1, wherein the replacement electrode member is made of silicon.

14. The apparatus according the claim 1, wherein a rubber sheet for enhancing thermal conductance is sandwiched between the support electrode member and the replacement electrode member.

15. The apparatus according the claim 1, wherein the bottom surface of the replacement electrode member is covered with a conductive shield member in a non-contacting or insulated state, and the conductive shield member is electrically connected to a grounded conductive portion.

16. The apparatus according the claim 15, wherein the grounded conductive portion is part of the process container.

17. The apparatus according the claim 15, wherein a ring-shaped insulator is disposed around the replacement electrode member, and the ring-shaped insulator has a bottom surface covered with the conductive shield member and an inner side surface covered with the replacement electrode member.

* * * * *